(12) United States Patent
Nansei

(10) Patent No.: US 8,431,919 B2
(45) Date of Patent: Apr. 30, 2013

(54) RESISTIVE CHANGE NON-VOLATILE SEMICONDUCTOR MEMORY DEVICE

(75) Inventor: Hiroyuki Nansei, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 12/883,593

(22) Filed: Sep. 16, 2010

(65) Prior Publication Data

US 2011/0210301 A1 Sep. 1, 2011

(30) Foreign Application Priority Data

Feb. 26, 2010 (JP) ................................. 2010-043117

(51) Int. Cl.
*H01L 45/00* (2006.01)

(52) U.S. Cl.
USPC ................. 257/4; 257/3; 257/5; 257/E45.002

(58) Field of Classification Search .................. 257/2, 3, 257/4, 5, E45.002, 4.5
See application file for complete search history.

(56) References Cited

U.S. PATENT DOCUMENTS

| 8,124,968 | B2 * | 2/2012 | Koo et al. ........................ 257/42 |
| 2009/0141547 | A1 * | 6/2009 | Jin et al. ........................ 365/163 |
| 2010/0259960 | A1 * | 10/2010 | Samachisa ....................... 365/51 |

FOREIGN PATENT DOCUMENTS

JP 2009-81251 4/2009

* cited by examiner

*Primary Examiner* — Jerome Jackson, Jr.
*Assistant Examiner* — Paul Budd
(74) *Attorney, Agent, or Firm* — Oblon, Spivak, McClelland, Maier & Neustadt, L.L.P.

(57) ABSTRACT

According to one embodiment, a non-volatile semiconductor memory device includes: a semiconductor substrate; a plurality of first lines; a plurality of second lines; and a plurality of non-volatile memory cells arranged at positions where the plurality of first lines intersect with the plurality of second lines, wherein each of the plurality of non-volatile memory cells includes a resistance change element and a rectifying element connected in series to the resistance change element, and a resistance change film continuously extending over the plurality of second lines is arranged between the plurality of first lines and the plurality of second lines, and the resistance change element includes a portion where the first line intersect with the second line in the resistance change film.

13 Claims, 21 Drawing Sheets

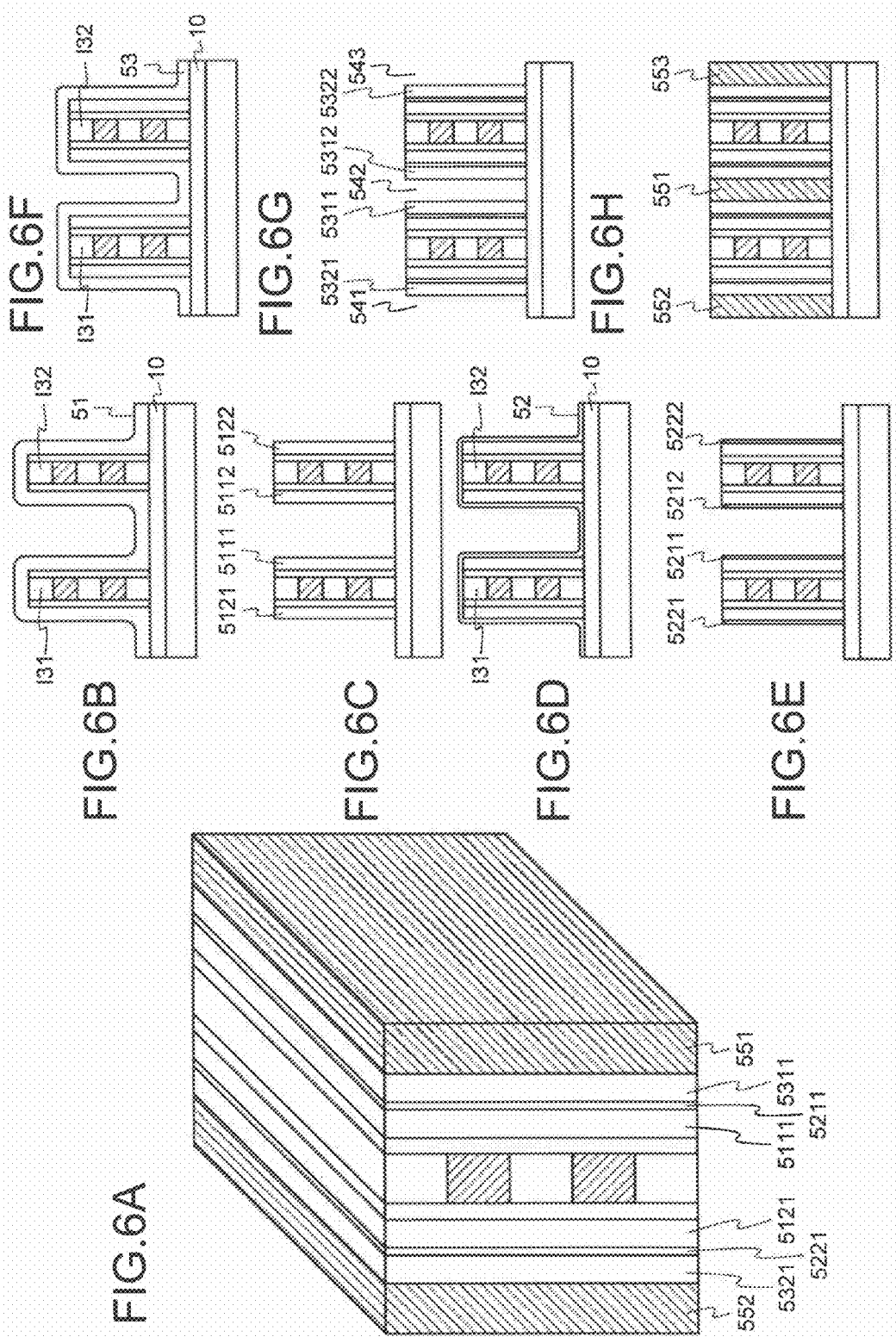

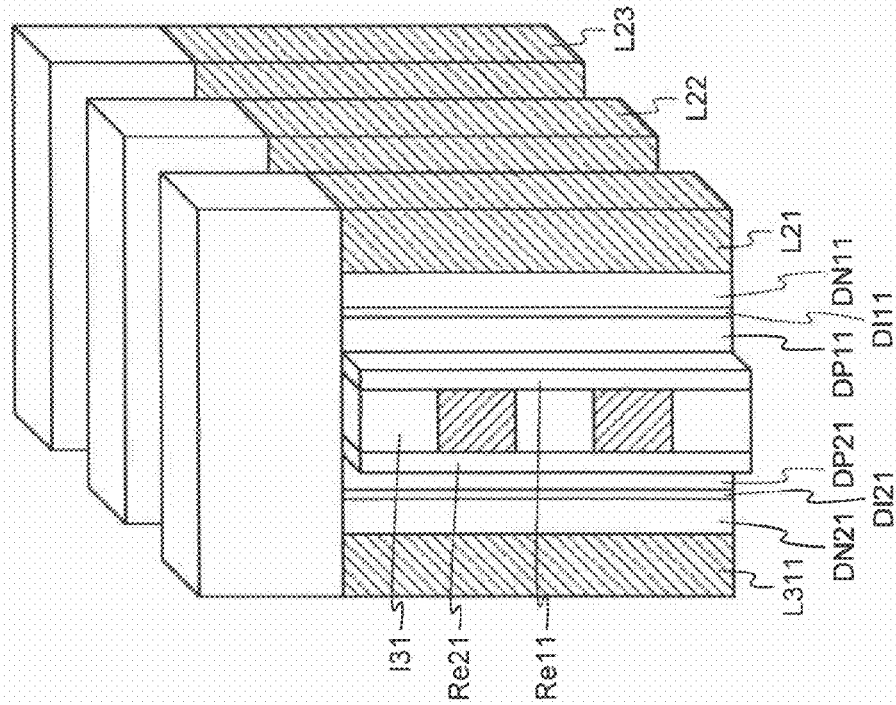
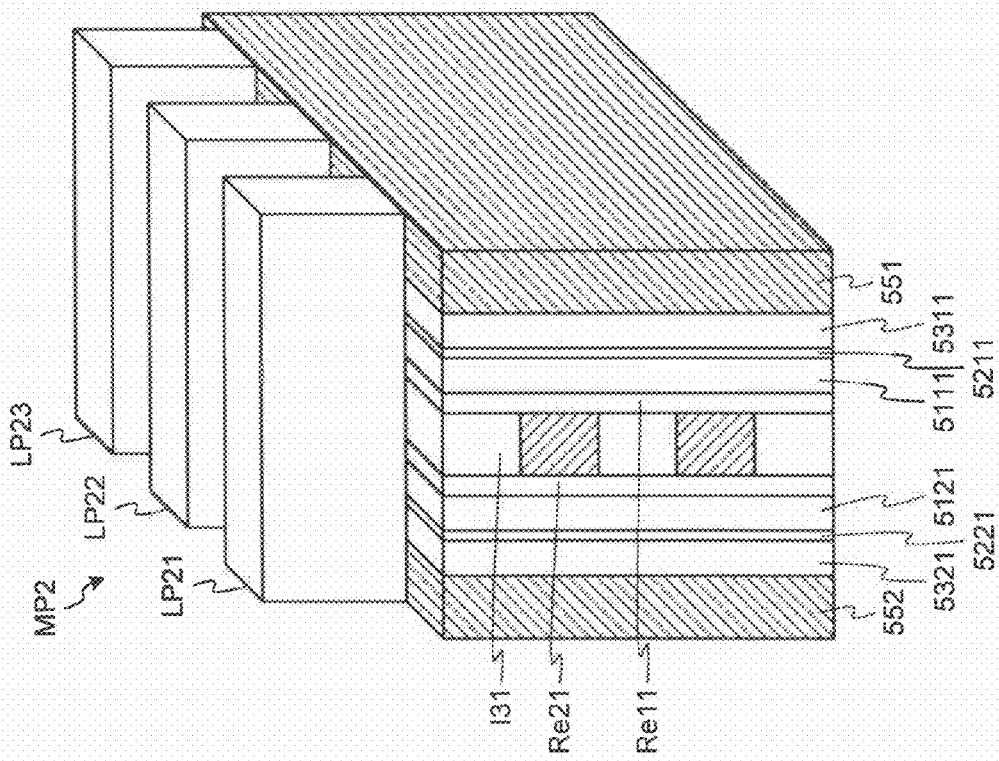

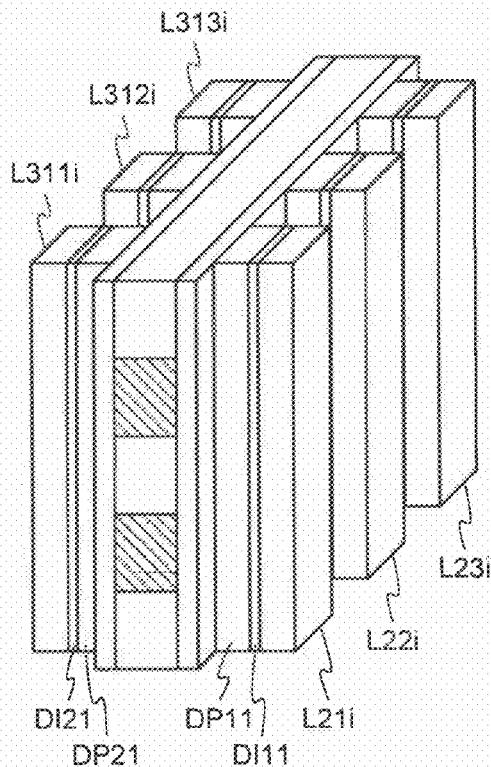
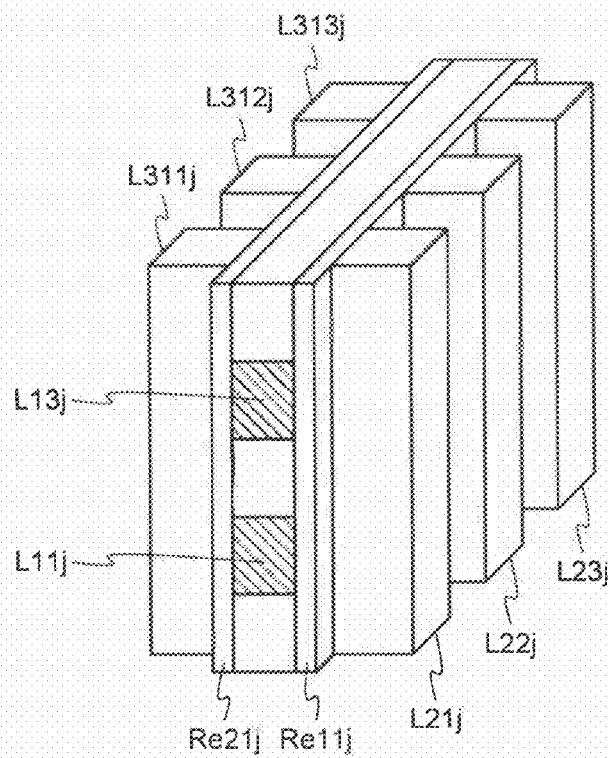

40k

51k

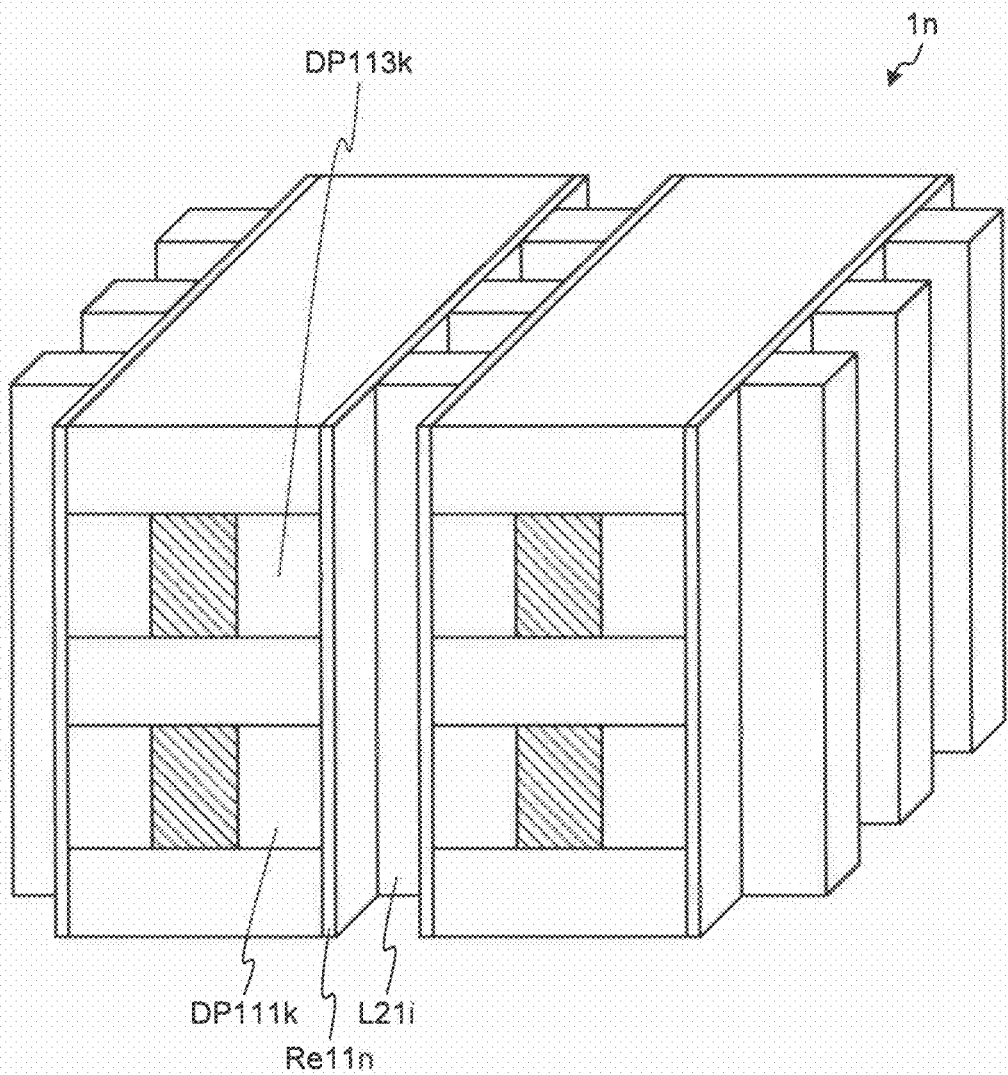

RESISTIVE CHANGE NON-VOLATILE SEMICONDUCTOR MEMORY DEVICE

CROSS-REFERENCE TO RELATED APPLICATIONS

This application is based upon and claims the benefit of priority from Japanese Patent Application No. 2010-043117, filed on Feb. 26, 2010; the entire contents of which are incorporated herein by reference.

FIELD

Embodiments described herein relate generally to a non-volatile semiconductor memory device and a method of manufacturing the non-volatile semiconductor memory device.

BACKGROUND

Non-volatile memories represented by NAND type flash memories have been widely used for mobile phones, digital still cameras, Universal Serial Bus (USB) memories, silicon audios, and the like to store a large amount of data, and its market further continuously expand by a rapid shrinkage to reduce a manufacturing cost per bit. However, it is said that the NAND type flash memories may have a limit in further enhancement of high uniformity, high reliability, high speed operation of transistor properties, and high integration of transistors when scaling is further promoted because the NAND type flash memories make use of a transistor operation which records information by a variation of a threshold value. Thus a novel non-volatile memory is demanded to break the limit.

As non-volatile memories for responding the demand, a phase-change memory (PCM) element and a resistive random access memory (ReRAM) element are exemplified. Since the phase-change memory element and the resistive random access memory element operate making use of a variable resistance state of a resistance material, the phase-change memory element and the resistive random access memory element have a feature that write/erase operations do not need a transistor operation and that more shrinkage of a size of a resistance material can lead to more improvement of properties of the element.

In a resistive random access memory, a plurality of resistance change elements are arranged in a matrix at a plurality of intersection position where a plurality of word lines extending in parallel with each other in a first direction intersect with a plurality of bit lines extending in parallel with each other in a second direction. Further, in the resistive random access memory, since sensing is performed by a current amount in a different way from a conventional NAND type flash memory, diodes (rectifying elements) for regulating a current direction from the word lines to the bits line are arranged in series to resistance change elements in respective memory cells.

When the non-volatile memory cells are arranged in a horizontal direction as described above, it is necessary to pattern the word lines and the bit lines by a different lithography process, respectively. In the case, to improve the arrangement density of the non-volatile memory cells, it is necessary to further increase the number of wiring layers and to stack a plurality of the horizontal arrangements of the non-volatile memory cells in a vertical direction. When the number of the wiring layers is increased, since the number of the lithography processes is increased, a cost reduction effect remains in a low level.

BRIEF DESCRIPTION OF THE DRAWINGS

FIG. 6A to FIG. 6H are views showing the method of manufacturing the non-volatile semiconductor memory device according to the first embodiment;

FIG. 7A and FIG. 7B are views showing the method of manufacturing the non-volatile semiconductor memory device according to the first embodiment;

FIG. 9 is a view showing a configuration of a non-volatile semiconductor memory device according to a modification of the first embodiment;

FIG. 10 is a view showing a configuration of a non-volatile semiconductor memory device according to another modification of the first embodiment;

FIG. 16 is a view showing a configuration of a non-volatile semiconductor memory device according to a modification of the second embodiment;

DETAILED DESCRIPTION

According to one embodiment, there is provided a non-volatile semiconductor memory device comprising: a semiconductor substrate; a plurality of first lines arranged side by side in a first plane approximately vertical to a surface of the semiconductor substrate, each of the plurality of first lines extending along the surface of the semiconductor substrate; a plurality of second lines arranged side by side in a second plane along the first plane, each of the plurality of second lines extending approximately vertical to the surface of the semiconductor substrate; and a plurality of non-volatile memory cells arranged at positions where the plurality of first lines intersect with the plurality of second lines, wherein each of the plurality of non-volatile memory cells includes a resistance change element and a rectifying element connected in series to the resistance change element, and a resistance change film continuously extending over the plurality of second lines is arranged between the plurality of first lines and the plurality of second lines, and the resistance change element includes a portion where the first line intersect with the second line in the resistance change film.

Non-volatile semiconductor memory devices according to the embodiments of the invention will be explained below in detail referring to accompanying drawings. Note that the scope of the invention is by no means limited by the embodiments.

First Embodiment

Figure 1:
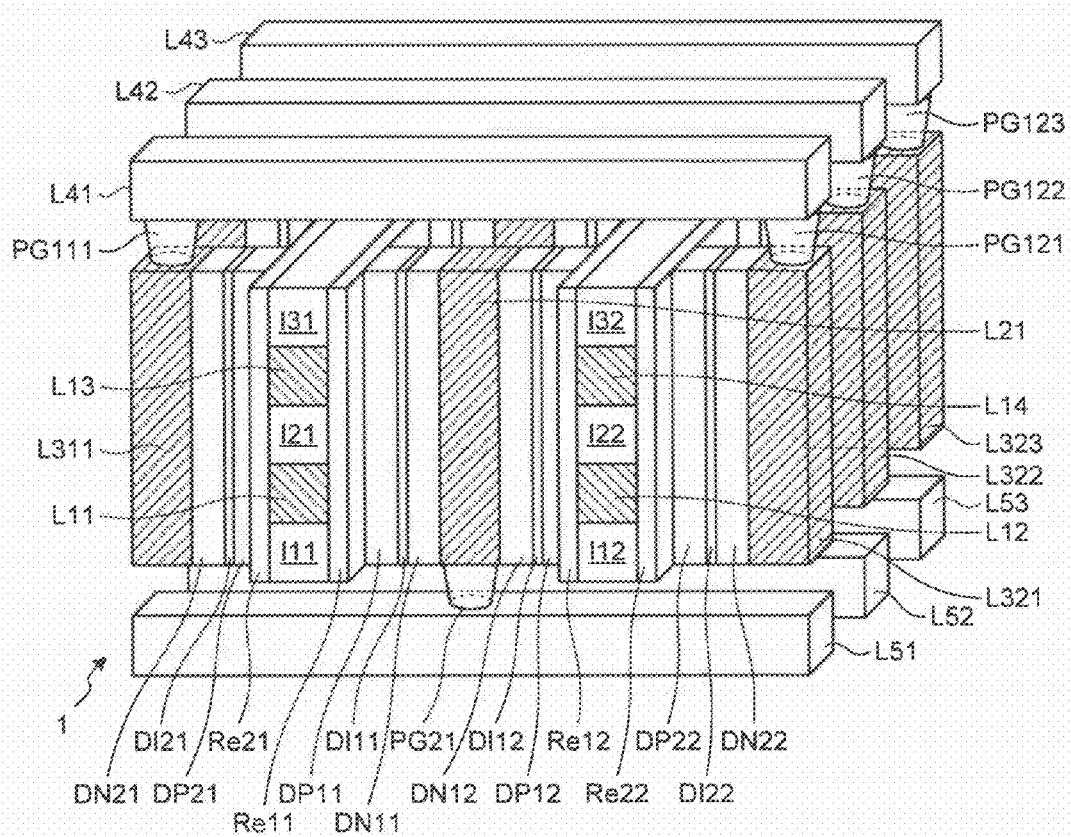
FIG. 1 is a view showing a configuration of a non-volatile semiconductor memory device according to a first embodiment.
Figure 2A:
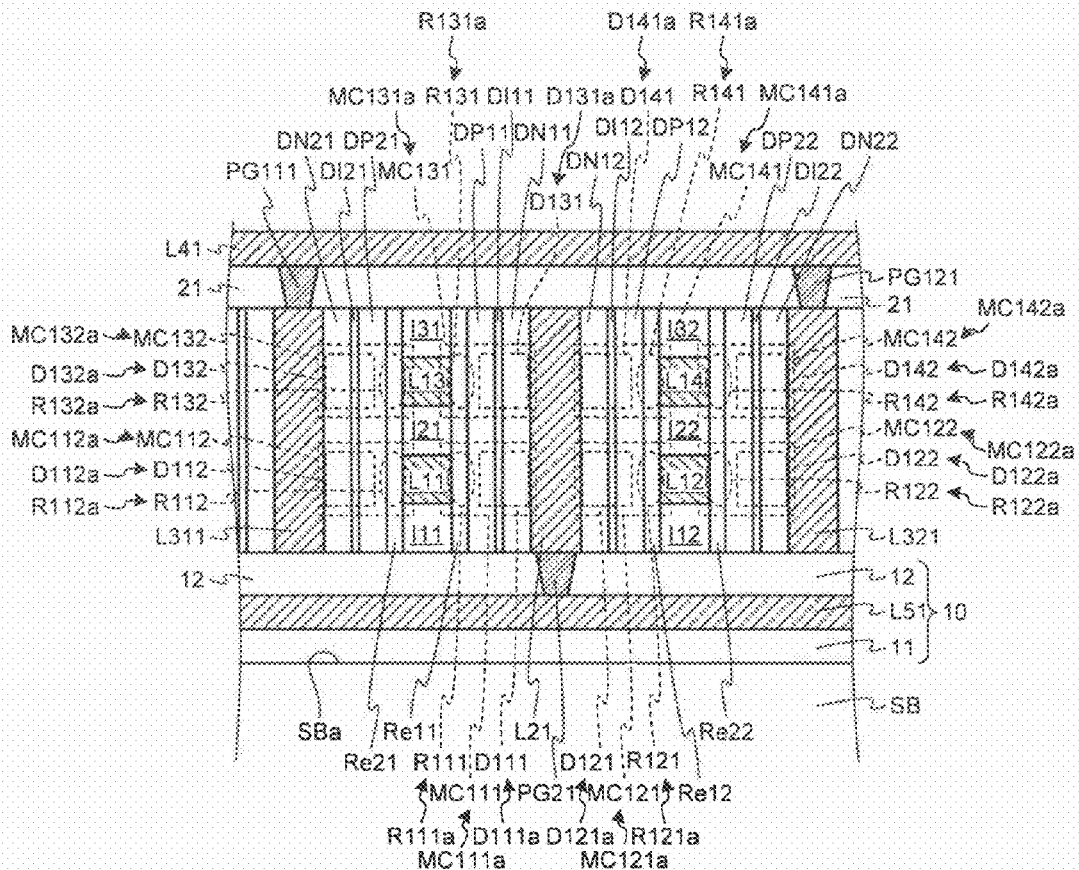
FIG. 2A and FIG. 2B are views showing a sectional configuration and a circuit configuration of the non-volatile semiconductor memory device according to the first embodiment.
Figure 2B:
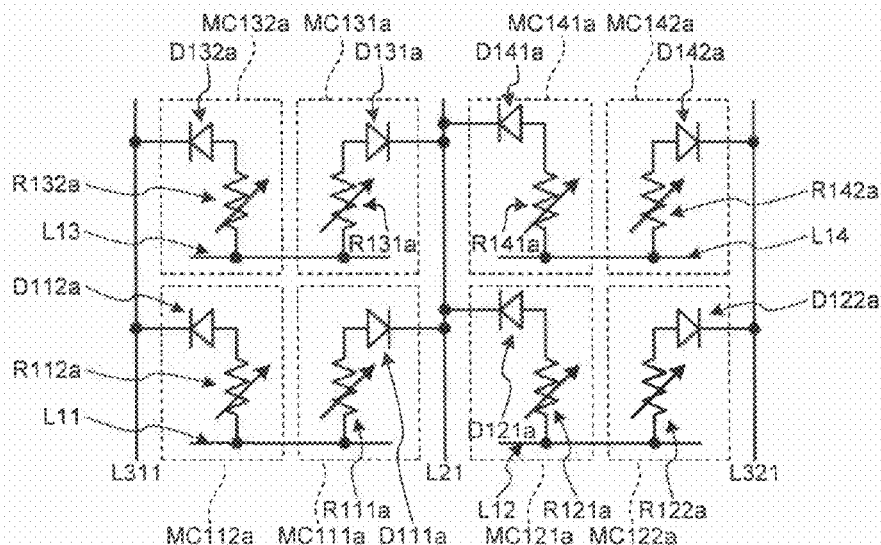
Figure 3:
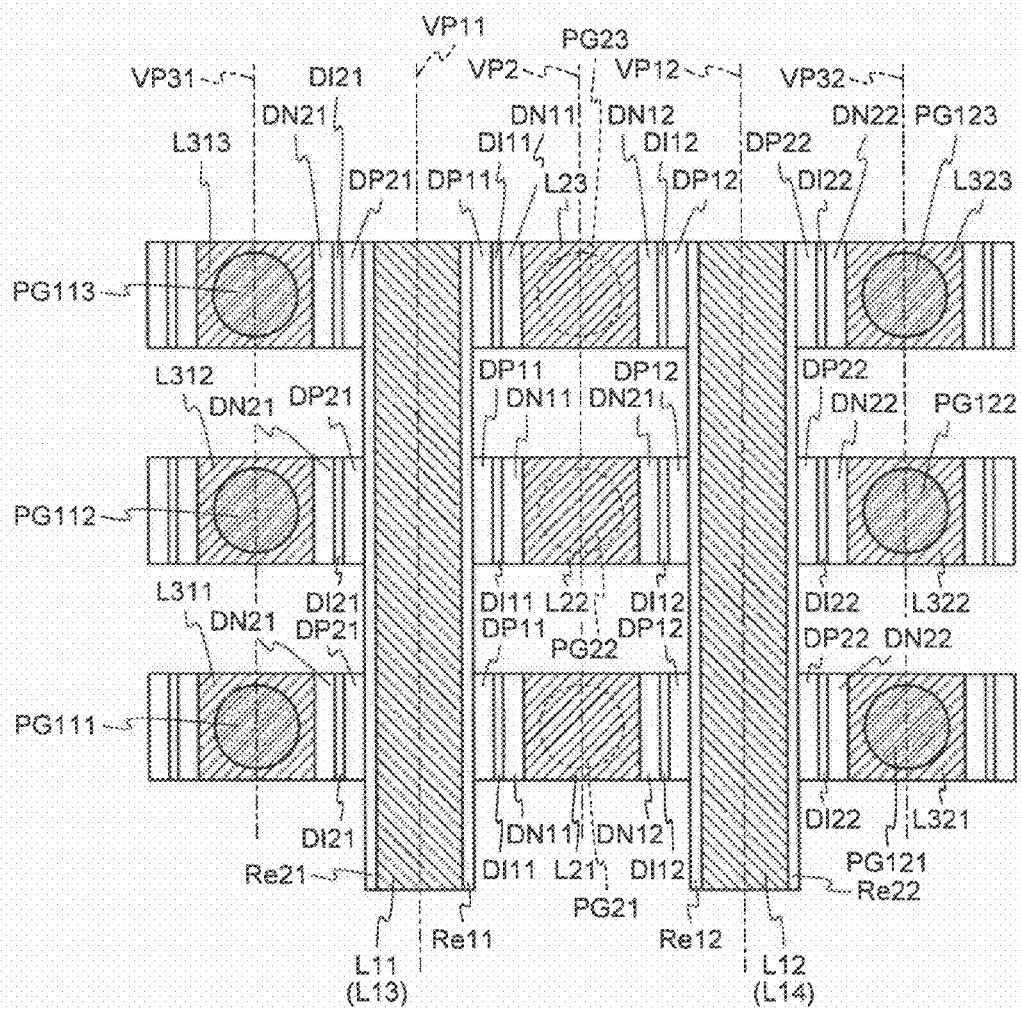
FIG. 3 is a view showing a layout configuration of the non-volatile semiconductor memory device according to the first embodiment.

A non-volatile semiconductor memory device 1 according to the first embodiment will be explained using FIG. 1 to FIG. 3. FIG. 1 is a perspective view showing a configuration of the non-volatile semiconductor memory device 1 according to the first embodiment. FIGS. 2A and 2B are views showing a sectional configuration and a circuit configuration of the non-volatile semiconductor memory device 1 according to the first embodiment. FIG. 3 is a view showing a layout configuration of the non-volatile semiconductor memory device 1 according to the first embodiment.

The non-volatile semiconductor memory device 1 shown in FIG. 1 includes a semiconductor substrate SB (refer to FIG. 2A), a plurality of first lines L11 to L14, a plurality of second lines L21 to L23 (refer to FIG. 3), a plurality of third lines L311 to L313, L321 to L323 (refer to FIG. 3), a plurality of fourth lines L41 to L43, a plurality of fifth lines L51 to L53, a plurality of first plugs PG111 to PG113, PG121 to PG123, a plurality of second plugs PG21 to PG23, resistance change films Re11, Re12, resistance change films (second resistance change film) Re21, Re22, a plurality of P-type polysilicon films DP11 to DP22, a plurality of I-type polysilicon films DI11 to DI22, and a plurality of N-type polysilicon films DN11 to DN22.

The semiconductor substrate SB (refer to FIG. 2A) is formed of, for example, a semiconductor such as silicon.

The plurality of first lines L11, L13 are arranged side by side to each other (for example, in parallel with each other) in a first plane VP11 approximately vertical to a surface SBa of the semiconductor substrate SB (refer to FIG. 3). The plurality of first lines L12, L14 are arranged side by side to each other (for example, in parallel with each other) in a first plane VP12 approximately vertical to the surface SBa of the semiconductor substrate SB (refer to FIG. 3). Each of the plurality of first lines L11 to L14 extends along the surface SBa of the semiconductor substrate SB (refer to FIG. 2A). Note that the first plane VP11 and the first plane VP12 are not restricted to a strict plane and may include planes having somewhat uneven portions (concaves and convexes) in a direction intersecting with the strict plane.

The plurality of second lines L21 to L23 are arranged side by side (for example, in parallel with each other) in a second plane VP2 (refer to FIG. 3). The second plane VP2 is a plane along the first plane VP11 (or VP12) and is, for example, a plane parallel with the first plane VP11 (or VP12). Each of the plurality of second lines L21 to L23 extends approximately vertical to the surface SBa of the semiconductor substrate SB (refer to FIG. 2A). Note that the second plane VP2 is not restricted to the strict plane and may include a plane having somewhat uneven portions (concaves and convexes) in a direction intersecting with the strict plane.

The plurality of third lines L311 to L313 are arranged side by side (for example, in parallel with each other) in a third plane VP31 (refer to FIG. 3). The third plane VP31 is a plane which is arranged on an opposite side of the second plane VP2 with respect to the first plane VP11 and which extends along the first plane VP11. The third plane VP31 is, for example, a plane parallel with the first plane VP11. Likewise, the plurality of third lines L321 to L323 are arranged side by side with each other (for example, in parallel with each other) in a third plane VP32. The third plane VP32 is a plane which is arranged on an opposite side of the second plane VP2 with respect to the first plane VP12 and which extends along the first plane VP12. The third plane VP32 is, for example, a plane parallel with the first plane VP12. Each of the plurality of third lines L311 to L313, L321 to L323 extends approximately vertical to the surface SBa of the semiconductor substrate SB (refer to FIG. 2A). Note that the third plane VP31 and the third plane VP32 are not restricted to a strict plane, respectively and may include a plane having somewhat uneven portions (concaves and convexes) in a direction intersecting with the strict plane.

The plurality of first lines L11 to L14 function as word lines, respectively. At the time, the plurality of second lines L21 to L23 and the plurality of third lines L311 to L313, L321 to L323 function as bit lines, respectively. In the case, the word lines extend in a direction along the surface SBa of the semiconductor substrate SB and are arranged side by side and have the plurality of stacked layers. The bit lines extend in a direction approximately vertical to the surface SBa of the semiconductor substrate SB and are arranged side by side.

Otherwise, the plurality of first lines L11 to L14 function as the bit lines, respectively. At the time, the plurality of second lines L21 to L23 and the plurality of third lines L311 to L313, L321 to L323 function as the word lines, respectively. In the case, the bit lines extend in the direction along the surface SBa of the semiconductor substrate SB and are arranged side by side and have the plurality of stacked layers. The word lines extend in the direction approximately vertical to the surface SBa of the semiconductor substrate SB and are arranged side by side.

Further, as shown in FIG. 2B, a plurality of non-volatile memory cells MC111a, MC121a, MC131a, MC141a (the non-volatile memory cells intersecting with the second lines L22, L23 are not shown) are arranged at the positions where the plurality of first lines L11 to L14 intersect with the plurality of second lines L21 to L23. The non-volatile memory cells MC111a, MC121a, MC131a, MC141a include resistance change elements R111a, R121a, R131a, R141a and diodes (rectifying elements) D111a, D121a, D131a, D141a connected in series to corresponding resistance change elements, respectively.

Likewise, the plurality of non-volatile memory cells (the plurality of second non-volatile memory cells) MC112a, MC122a, MC132a, MC142a (the non-volatile memory cells intersecting with the third lines L312, L313, L322, L323 are not shown) are arranged at the positions where the plurality of third lines L311 to L323 intersect with the plurality of first lines L11 to L14. The non-volatile memory cells MC112a, MC122a, MC132a, MC142a include resistance change elements (second resistance change elements) R112a, R122a, R132a, R142a and diodes (second rectifying elements) D112a, D122a, D132a, D142a connected in series to corresponding resistance change elements, respectively.

The plurality of fourth lines L41 to L43 shown in FIG. 1 extend, so as to intersect with the first line L11 (or L13), above the plurality of second lines L21, L22, L23 and the plurality of third lines L311, L312, L313 which face each other across the plurality of first lines L11, L13. The plurality of fourth lines L41 to L43 are arranged side by side with each other (for example, in parallel with each other) in a plane (not shown) parallel with the surface SBa of the semiconductor substrate SB. The plurality of fourth lines L41 to L43 extend, so as to intersect with the first line L12 (or L14), above the plurality of second lines L21, L22, L23 and the plurality of third lines L321, L322, L323 which face each other across the plurality of first lines L12, L14. Insulation films 21 are arranged between the plurality of fourth lines L41 to L43 and the plurality of first lines L11 to L14 (refer to FIG. 2A).

The plurality of fifth lines L51 to L53 extend, so as to intersect with the first line L11 (or L13), between the semiconductor substrate SB and the plurality of second lines L21, L22, L23 and the plurality of third lines L311, L312, L313 which face each other across the plurality of first lines L11, L13. The plurality of fifth lines L51 to L53 are arranged side by side with each other (for example, in parallel with each other) in a plane (not shown) parallel with the surface SBa of the semiconductor substrate SB. The plurality of fifth lines L51 to L53 extend, so as to intersect with the first line L12 (or L14), between the semiconductor substrate SB and the plurality of second lines L21, L22, L23 and the plurality of third lines L321, L322, L323 which face each other across the plurality of first lines L12, L14. Insulation films 11 are arranged between the plurality of fifth line L51 to L53 and the semiconductor substrate SB (refer to FIG. 2A). Insulation films 12 are arranged between the plurality of first lines L11 to L14 and the plurality of fifth lines L51 to L53 (refer to FIG. 2A).

Each of the plurality of first plugs PG111 to PG113 connects either one of the second line L21 (or L22, L23) and the third line L311 (or L312, L313) which face each other across the first line L11 (or L13), to the fourth line L41 (or L42, L43). In the case of FIG. 3, the plurality of first plugs PG111 to PG113 connect the third line L311 to L313 to the fourth line L41 to L43, respectively. Each of the plurality of first plugs PG121 to PG123 connects either one of the second line L21 (or L22, L23) and the third line L321 (or L322, L323) which face each other across the first line L12 (or L14), to the fourth line L41 (or L42, L43). In the case of FIG. 3, the plurality of first plugs PG121 to PG123 connect the third line L321 to L323 to the fourth line L41 to L43, respectively.

Each of the plurality of second plugs PG21 to PG23 connects the other of the second line L21 (or L22, L23) and the third line L311 (or L312, L313) which face each other across the first line L11 (or L13), to the fifth line L51 (or L52, L53). In the case of FIG. 3, the plurality of second plugs PG21 to PG23 connect the second line L21 (or L22, L23) to the fifth line L51 to L53, respectively.

The resistance change film Re11 continuously extends between the first plane VP11 and the second plane VP2 (refer to FIG. 3) over the plurality of second lines L21 to L23. The resistance change film Re12 continuously extend between the first plane VP12 and the second plane VP2 (refer to FIG. 3) over the plurality of second lines L21 to L23 (refer to FIG. 3). Specifically, each of the plurality of resistance change films Re11, Re12 extends on insulation films 12 approximately vertical to the surface SBa of the semiconductor substrate SB in a fin state. More specifically, each of the plurality of resistance change films Re11, Re12 extends in a sheet state between the plurality of first lines L11, L13 and the plurality of second lines L21 to L23 over the plurality of first lines L11, L13 as well as over the plurality of second lines L21 to L23, respectively. The plurality of resistance change films Re11, Re12 are arranged side by side with each other (for example, in parallel with each other) when viewed from a direction vertical to the surface SBa of the semiconductor substrate SB (refer to FIG. 3).

As shown in FIG. 2A, the resistance change elements R111a, R131a include, in the resistance change film Re11, portions arranged at positions where the first lines L11, L13 intersect with the second line L21, as storage units R111, R131 for storing data by a resistance change, respectively. The resistance change elements R121a, R141a include, in the resistance change film Re12, portions arranged at positions where the first lines L12, L14 intersect with the second line L21, as storage units R121, R141 for storing data by a resistance change, respectively.

The resistance change film (second resistance change film) Re21 shown in FIG. 1 continuously extends between the first plane VP11 and the third plane VP31 (refer to FIG. 3) over the plurality of third lines L311 to L313. The resistance change film (second resistance change film) Re22 continuously extends between the first plane VP12 and the third plane VP32 (refer to FIG. 3) over the plurality of third lines L321 to L323 (refer to FIG. 3). Specifically, each of the plurality of resistance change films Re21, Re22 extends on the insulation films 12 approximately vertical to the surface SBa of the semiconductor substrate SB in the fin state. More specifically, each of the plurality of resistance change films Re21, Re22 extends in a sheet state between the plurality of first lines L11, L13 and the plurality of third lines L321 to L323 over the plurality of first lines L11, L13 as well as over the plurality of third lines L321 to L323, respectively. The plurality of resistance change films Re21, Re22 are arranged side by side with each other (for example, in parallel with each other) when viewed from a direction vertical to the surface SBa of the semiconductor substrate SB (refer to FIG. 3). The resistance change films Re21, Re22 face the resistance change films Re11, Re12 across the plurality of first lines L11, L12, respectively.

As shown in FIG. 2A, the resistance change elements (second resistance change elements) R112a, R132a include, in the resistance change film (second resistance change film) Re21, portions arranged at positions where the first lines L11, L13 intersect with the third line L311, as storage units R112, R132 for storing data by a resistance change, respectively. The resistance change elements (second resistance change elements) R122a, R142a include, in the resistance change film (second resistance change film) Re22, portions arranged at positions where the first lines L12, L14 intersect with the third line L321, as storage units R122, R142 for storing data by a resistance change, respectively.

The respective resistance change elements R111a to R142a are resistive random access memory (ReRAM) elements. In the case, each of the resistance change films Re11, Re12 and the resistance change film Re21, Re22 is formed of a material (hereinafter, called a resistance change material) selected from a group of, for example, $ZnMn_2O_4$, NiO, HfO, $TiO_2$, $SrZrO_3$, $Pr_{0.7}Ca_{0.3}MnO_3$. Note that respective resistance change elements R111a to R142a may be phase-change memory (PCM) element in substitution for the resistive random access memory elements.

The plurality of P-type polysilicon films DP11, DP12 shown in FIG. 1 are located adjacent to the resistance change films Re11, Re12 on a side opposite to the first lines L11, L12, respectively. The plurality of P-type polysilicon films DP21, DP22 are located adjacent to the resistance change films Re21, Re22 on a side opposite to the first lines L11, L12, respectively. The plurality of P-type polysilicon films DP11 to DP22 have a width corresponding to the second line or the third line and extend approximately vertical to the surface SBa of the semiconductor substrate SB, respectively. The plurality of P-type polysilicon films DP11 to DP22 are formed of polysilicon containing P-type impurities (for example, boron), respectively.

The plurality of I-type polysilicon films DI11, DI12 are located adjacent to the P-type polysilicon films DP11, DP12 on a side opposite to the resistance change films Re11, Re12, respectively. The plurality of I-type polysilicon films DI21, DI22 are located adjacent to the P-type polysilicon films DP21, DP22 on a side opposite to the resistance change films Re21, Re22, respectively. The plurality of I-type polysilicon films DI11 to DI22 have a width corresponding to the second line or the third line and extend approximately vertical to the surface SBa of the semiconductor substrate SB, respectively.

The plurality of N-type polysilicon films DN11, DN12 are located adjacent to the I-type polysilicon films DI11, DI12 on a side opposite to the P-type polysilicon films DP11, DP12. The plurality of N-type polysilicon films DN21, DN22 are located adjacent to the I-type polysilicon films DI21, DI22 on a side opposite to the P-type polysilicon films DP21, DP22, respectively. The plurality of N-type polysilicon films DN11 to DN22 have a width corresponding to the second line or the third line and extend approximately vertical to the surface SBa of the semiconductor substrate SB, respectively. The plurality of N-type polysilicon films DN11 to DN22 are formed of polysilicon containing N-type impurities (for example, phosphorus, arsenide).

As shown in FIG. 2A, the diodes (rectifying elements) D111a, D131a include, in the P-type polysilicon film DP11, the I-type polysilicon film DI11, and the N-type polysilicon film DN11, portions arranged at positions where the first lines L11, L13 intersect with the second line L21, as rectifier portions D111, D131. Similarly, rectifier portions D121, D141 are included in the diodes (rectifying element) D121a, D141a.

The diodes (second rectifying elements) D112a, D132a include, in the P-type polysilicon film DP21, the I-type polysilicon film DI21, and the N-type polysilicon film DN21, portions arranged at positions where the first lines L11, L13 intersect with the third line L311, as rectifier portions D112, D132, respectively. Similarly, rectifier portions D122, D142 are also included in the diodes (second rectifying elements) D122a, D142a.

Rectifying directions in the respective diodes D111a to D142a are directions along the surface SBa of the semiconductor substrate SB. More specifically, the P-type polysilicon film, the I-type polysilicon film, and the N-type polysilicon film are formed connecting to the line (second line or third line) extending in a direction approximately vertical to the semiconductor substrate (refer to FIG. 3) and shared by the non-volatile memory cells located at substantially the same positions when viewed from a direction vertical to the semiconductor substrate. With the configuration, since a buried diode need not be formed, portions functioning as diodes can be relatively easily fabricated.

There is tentatively examined a case in which word lines and bit lines are patterned such that the word lines and the bit lines intersect with each other as different wiring layers and non-volatile memory cells are arranged at the intersection positions of the word lines and the bit lines. When the non-volatile memory cells are arranged in a horizontal direction (two-dimensionally arranged in a direction along a horizontal plane), the word lines and the bit lines have to be patterned by a different lithography process, respectively. In the case, to improve the arrangement density of the non-volatile memory cells, it is necessary to further increase the number of the wiring layers and to stack the plurality of the horizontal arrangements of the non-volatile memory cells in a vertical direction. More specifically, when the number of the wiring layers is increased to arrange the non-volatile memory cells also in the vertical direction in addition to the horizontal direction, since the number of the lithography processes is increased, a cost reduction effect obtained by improving the arrangement density remains in a low level.

In contrast, in the first embodiment, ones of the word lines and the bit lines (respective first lines L11 to L14) extend parallel to the surface of the semiconductor substrate, and the others (respective second lines L21 to L23 and respective third lines L311 to L313, L321 to L323) of the word lines and the bit lines extend approximately vertical to the surface of the semiconductor substrate. In the resistance change films, portions arranged at positions where the word lines intersect with the bit lines function as non-volatile memory cells MC111 to MC142. This structure is suitable to pattern the plurality of word lines at a time and to pattern the plurality of bit lines at a time as described later. More specifically, since the number of the lithography processes does not increase even if the non-volatile memory cells are arranged also in the vertical direction in addition to the horizontal direction, there can be provided a structure by which the cost reduction effect can be increased by increasing the arrangement density. That is, there can be provided a structure by which the arrangement density of the non-volatile memory cells can be easily improved, so that the manufacturing cost of the non-volatile semiconductor memory device can be efficiently reduced.

Otherwise, there is tentatively examined a case where resistance change elements are formed by forming a stacked structure in which insulation films and first electrodes are alternately stacked a plurality of times on a semiconductor substrate, forming through-holes passing through the first electrodes of the plurality of layers, and then sequentially burying a resistance change material and a conductive material in the through-holes. In the case, in the resistance change elements, resistance change portions formed of the resistance change material buried in the through-holes have outer peripheral surfaces in contact with the first electrodes and inner peripheral surfaces in contact with second electrodes formed of the above-described conductive material. In the configuration, it is necessary to make the width of the first electrodes wider than that of the through-holes when viewed from a direction vertical to a main surface (front surface) of the semiconductor substrate. More specifically, since it is necessary to make the width of the first electrodes wider than that of the through-holes at least by a size corresponding to an alignment margin, it is difficult to improve the arrangement density of a memory cell (non-volatile memory cell) including the resistance change portion (resistance change elements).

In contrast, in the first embodiment, ones of the word lines and the bit lines (respective first lines L11 to L14) extend parallel to the surface of the semiconductor substrate, and the others (respective second lines L21 to L23 and respective third lines L311 to L313, L321 to L323) of the word lines and the bit lines extend approximately vertical to the surface of the semiconductor substrate. In the resistance change films, the portions arranged at positions where the word lines intersect with the bit lines function as the non-volatile memory cells MC111 to MC142. More specifically, since through-holes are not formed to the word lines and the bit lines, the arrangement margins of the word lines and the bit lines are easily increased, and thus the first embodiment has a structure which is unlike to be affected by an alignment offset. With the configuration, since it is not necessary to make the word lines and the bit lines wider than a width of the through-hole, respectively, the arrangement density of the non-volatile memory cells including the resistance change elements can be easily improved.

Further, in the first embodiment, since the resistance change films are formed on both sides of the lines (respective first line L11 to L14) extending in parallel with the surface of the semiconductor substrate, the arrangement density of the non-volatile memory cells can be efficiently improved as compared with a case that the resistance change films are arranged on one sides of the lines extending in parallel with the surface of the semiconductor substrate.

Figure 23:
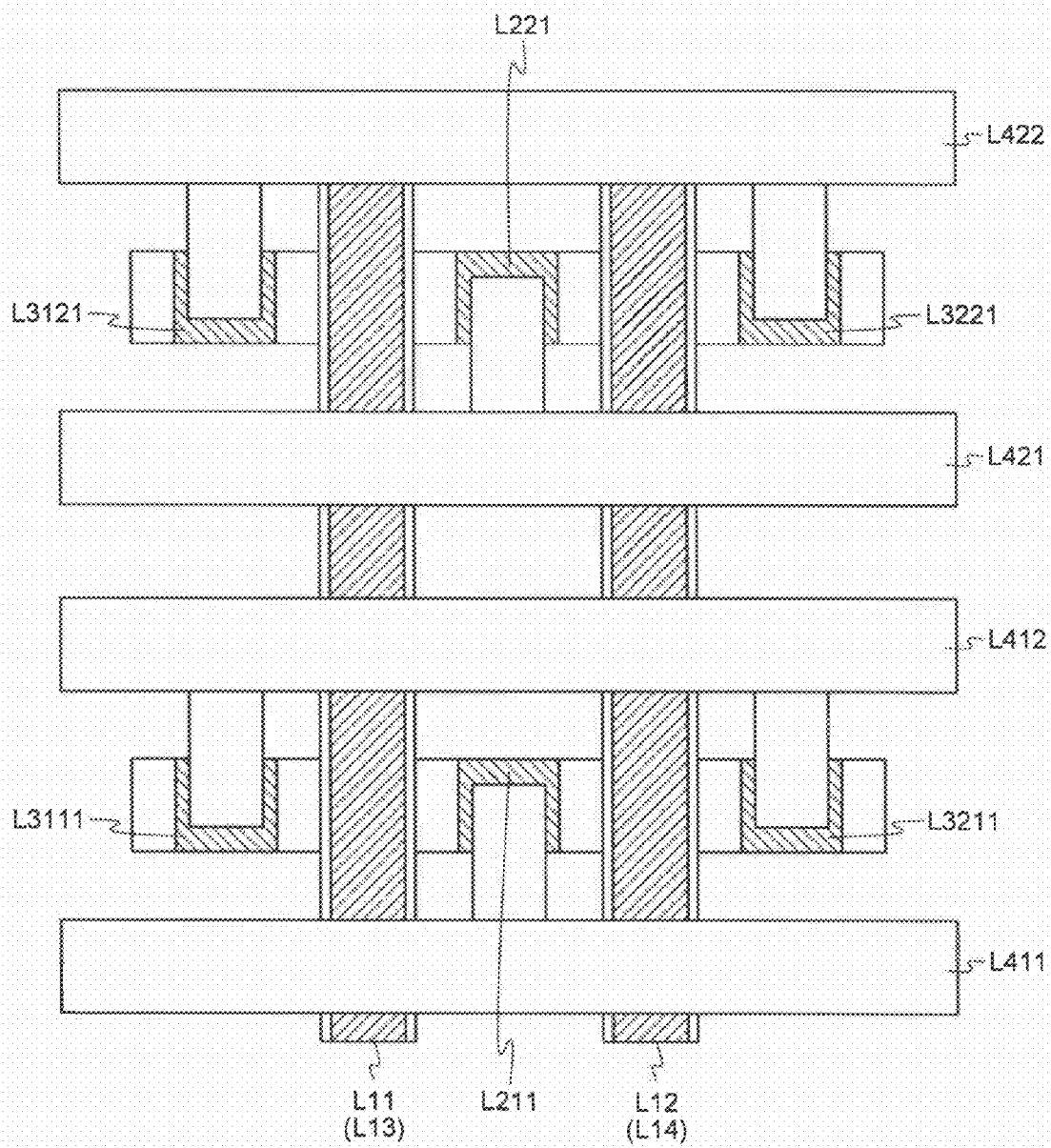
FIG. 23 is a view showing a layout configuration of a non-volatile semiconductor memory device according to a comparative example.

Otherwise, there is tentatively examined a case in which any of lines extending approximately vertical to a surface of a semiconductor substrate is connected to an upper fourth line via a plug as shown in FIG. 23. In the case, to separately access non-volatile memory cells on both sides of lines (respective first lines L11 to L14) extending in parallel with the surface of the semiconductor substrate, a fourth line L411 to be connected to a second line L211 and a fourth line L412 to be connected to a third line L3111 or L3211 have to be separately provided. More specifically, the two fourth lines L411 and L412 are provided to a group of the second line L211 and the third line L3111 or L3211 which face each other across the first line L11 or L12. Likewise, two fourth lines L421 and L422 are provided to a group of the second line L221 and the third line L3121 or L3221 which face each other across the first line L11 or L12. As a result, for example, arrangement intervals of the plurality of the second lines L211, L221 and arrangement intervals of the plurality of the third lines L3111, L3121 or L3211, L3221 have to be secured in a size larger than the total width of the two fourth lines. With the configuration, it becomes difficult to improve the arrangement density of non-volatile memory cells in the direction where the second lines are arranged (in the direction where the third lines are arranged.

In contrast, in the first embodiment, the lines (respective second lines L21 to L23 and respective third line L311 to L313, L321 to L323) which extend approximately vertical to the surface of the semiconductor substrate, are connected, in a direction where the respective second and third lines intersect with the first line, alternately to the upper fourth lines and the lower fifth lines (refer to FIG. 3). More specifically, the first plugs PG111 to PG113 connect the third lines L311 to L313 to the upper fourth lines L41 to L43, respectively. The second plugs PG21 to PG23 connect the second lines L21 to L23 to the lower fifth lines L51 to L53, respectively. The first plugs PG121 to PG123 connect the third lines L321 to L323 to the upper fourth lines L41 to L43, respectively. With this configuration, even when the non-volatile memory cells on both the sides of the first line extending in parallel with the surface of the semiconductor substrate are separately to be accessed, since it is sufficient to provide the one fourth line to a group of the second line and the third line which face each other across the first line, it is sufficient to secure an arrangement interval of the second lines and the third lines approximately as large as the width of the one fourth line. As a result, the arrangement density of the non-volatile memory cells can be easily improved in the direction where the second lines are arranged (in the direction where the third lines are arranged).

A method of manufacturing the non-volatile semiconductor memory device 1 according to the first embodiment will be explained using FIG. 4A to FIG. 8. FIG. 4A to FIG. 8 are views showing the method of manufacturing the non-volatile semiconductor memory device according to the first embodiment.

Figure 4A:
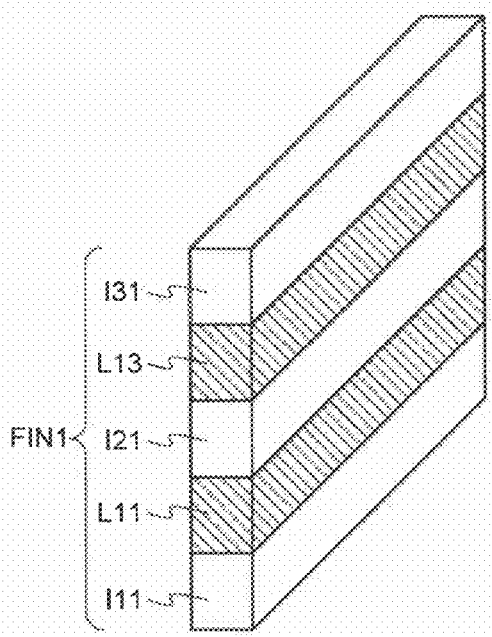
FIG. 4A to FIG. 4D are views showing a method of manufacturing the non-volatile semiconductor memory device according to the first embodiment.
Figure 4B:
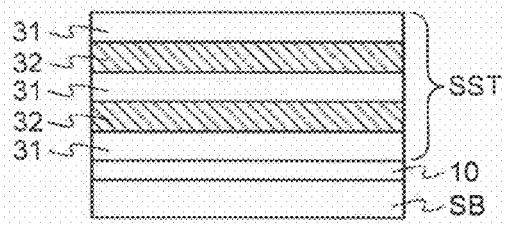

In a process shown in FIG. 4B, the insulation films 11, the fifth line L51 to L53, the insulation films 12, and the second plugs PG21 to PG23 are sequentially formed on the semiconductor substrate SB by a known method (refer to FIG. 2A). The insulation films 11, the fifth line L51 to L53, the insulation films 12, and the second plugs PG21 to PG23 will be collectively explained and illustrated as a lower layer 10 below for the purpose of simplification of explanation. At the time, an upper surface of the lower layer 10 is made flat, and upper surfaces of the second plugs PG21 to PG23 are also exposed.

In (a first process), a stacked structure SST, in which insulation layers (first layers) 31 and conductive layers (second layers) 32 are alternately stacked on the lower layer 10 multiple times, is formed. Specifically, a process for forming insulation layers 31 and a process for forming the conductive layers 32 are alternately repeated multiple times (for example, eight times, or twice as shown in FIG. 4B), after that, a process for forming an insulation layer 31 is performed once. The insulation layers 31 are formed of, for example, $SiO_2$ by CVD. The conductive layers 32 are formed of, for example, tungsten by PVD or CVD. Note that it is advantageous to form the conductive layers 32 by PVD from a view point of device properties because the conductive layers 32 have a lower resistance.

Figure 4C:
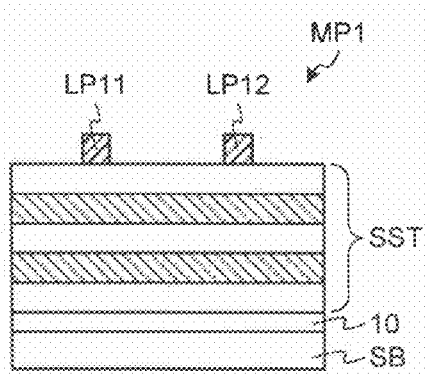

In a process (second process) shown in FIG. 4C, a first mask pattern MP1 is formed on the stacked structure SST using lithography. The first mask pattern MP1 has a plurality of first line patterns LP11, LP12. The plurality of first line patterns LP11, LP12 are arranged side by side with each other (for example, in parallel with each other).

Figure 4D:
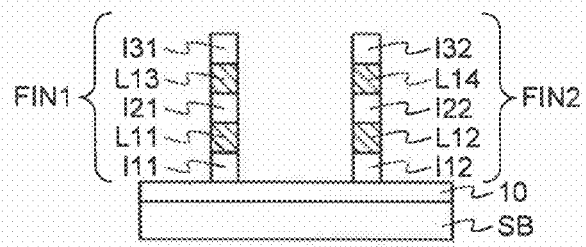

In a process (third process) shown in FIG. 4D, the stacked structure SST is cut off to many fins arranged side by side with each other (for example, in parallel with each other) using dry etching. More specifically, a region where the stacked structure SST is exposed by the first mask pattern MP1 is selectively etched such that the stacked structure SST is divided to a plurality of fin-shaped members FIN1, FIN2. With the process, the plurality of fin-shaped members FIN1, FIN2, which are arranged side by side with each other (for example, in parallel with each other) on the lower layer 10, are formed (refer to FIG. 4A). In the fin-shaped member FIN1, insulation films and conductive films are alternately stacked. In the fin-shaped member FIN1, for example, an insulation film I11, a conductive film (first line) L11, an insulation film I21, a conductive film (first line) L13, and an insulation film I31 are sequentially stacked. In the fin-shaped member FIN2, insulation films and conductive films are alternately stacked. In the fin-shaped member FIN2, for example, an insulation film I12, a conductive film (first line) L12, an insulation film I22, a conductive film (first line) L14, and an insulation film I32 are sequentially stacked.

Figure 5A:
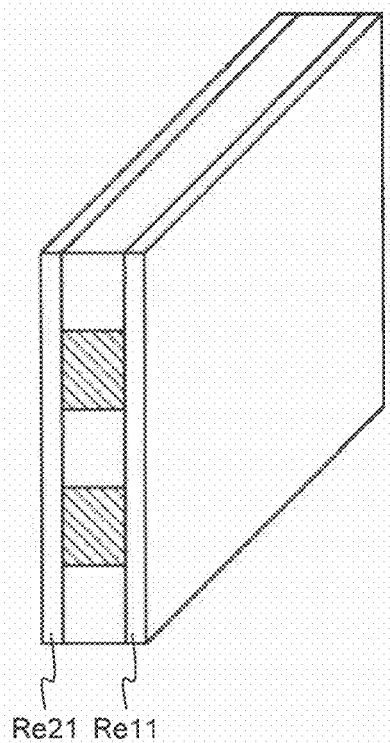
FIG. 5A to FIG. 5C are views showing the method of manufacturing the non-volatile semiconductor memory device according to the first embodiment.
Figure 5B:
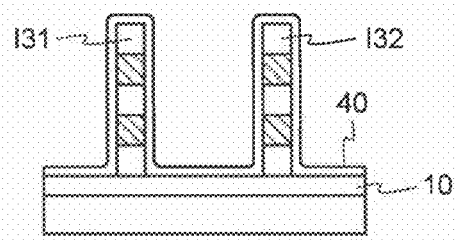
Figure 5C:
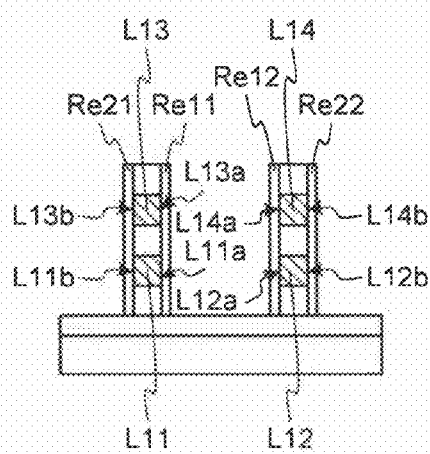

In a process (fourth process) shown in FIG. 5A to FIG. 5C, resistance change films are formed to side surfaces where the conductive films are exposed, of the plurality of fin-shaped members FIN1, FIN2.

Specifically, in a process shown in FIG. 5B, a film 40 of a resistance change material is deposited on an entire surface by CVD (for example, ALD as a kind of CVD). In a process shown in FIG. 5C, etch back is performed by dry etching. With the process, a portion covering the lower layer 10 and portions covering upper surfaces of the insulation film I31 and the insulation film I32 in the film 40 of the resistance change material are removed so that portions arranged on both side surfaces of the fin-shaped members FIN1, FIN2 in the film 40 of the resistance change material are remained as the resistance change films Re11 to Re22 (refer to FIG. 5A). More specifically, the resistance change films Re11 are formed to an exposed side surface L11a of the conductive film L11 and to an exposed side surface L13a of the conductive film L13. The resistance change films (second resistance change film) Re21 are formed to an exposed side surface L11b of the conductive film L11 and to an exposed side surface L13b of the conductive film L13. The resistance change films Re12 are formed to an exposed side surface L12a of the conductive film L12 and to an exposed side surface L14a of the conductive film L14. The resistance change films (second resistance change film) Re22 are formed to an exposed side surface L12b of the conductive film L12 and to an exposed side surface L14b of the conductive film L14.

In a process (fifth process) shown in FIG. 6A, a conductive material is buried between the plurality of fin-shaped members FIN1, FIN2 having undergone the process shown in FIG. 5.

Specifically, in a process shown in FIG. 6B, a P-type polysilicon film 51 is deposited on the entire surface by CVD (for example, Atomic Layer Deposition (ALD) as a kind of CVD). The P-type polysilicon film 51 is formed of polysilicon containing P-type impurities (for example, boron). In a process shown in FIG. 6C, etch back is performed by dry etching. With the process, a portion covering the lower layer 10 and portions covering upper surfaces of the insulation films I31 and the insulation films I32 in the P-type polysilicon film 51 are removed such that portions arranged on both side walls of the fin-shaped members FIN1, FIN2 in the P-type polysilicon film 51 are remained as P-type polysilicon films 5111 to 5122.

In a process shown in FIG. 6D, an I-type polysilicon film 52 is deposited on the entire surface by CVD (for example, ALD as a kind of CVD). The I-type polysilicon film 51 is formed of polysilicon. In a process shown in FIG. 6E, etch back is performed by dry etching. With the process, a portion covering the lower layer 10 and portions covering upper surfaces of the insulation films I31 and the insulation films I32 in the I-type polysilicon film 52 are removed such that portions arranged on both side walls of the fin-shaped members FIN1, FIN2 in the I-type polysilicon film 52 are remained as I-type polysilicon films 5211 to 5222.

In a process shown in FIG. 6F, an N-type polysilicon film 53 is deposited on the entire surface by CVD (for example, ALD as a kind of CVD). The N-type polysilicon film 53 is formed of polysilicon containing N-type impurities (for example, phosphorus, arsenide). In a process shown in FIG. 6G, etch back is performed by dry etching. With the process, a portion covering the lower layer 10 and portions covering upper surfaces of the insulation films I31 and the insulation films I32 in the N-type polysilicon film 53 are removed such that portions arranged on both side walls of the fin-shaped members FIN1, FIN2 in the N-type polysilicon film 53 are remained as N-type polysilicon films 5311 to 5322.

In a process shown in FIG. 6H, a conductive material is deposited so as to be embedded in grooves 541 to 543 between the plurality of fin-shaped members FIN1, FIN2, that is, between the N-type polysilicon films 5311 to 5322. The conductive material is formed of, for example, tungsten. When a conductive material on a surface is removed by CMP or etch back, a minute cell structure can be created. With the process, conductive materials 551 to 553 have been embedded.

In a process (sixth process) shown in FIG. 7A, a second mask pattern MP2 is formed on the plurality of fin-shaped members FIN1, FIN2 and the embedded conductive materials 551 to 553 (refer to FIG. 6H) between using lithography. The second mask pattern MP2 has a plurality of second line patterns LP21 to LP23. The respective second line patterns LP21 to LP23 extend in a direction intersecting with the fin-shaped members FIN1, FIN2. The plurality of second line patterns LP21 to LP23 are arranged side by side with each other (for example, in parallel with each other).

In a process (seventh process) shown in FIG. 7B, the P-type polysilicon films 5111, 5121, the I-type polysilicon films 5211, 5221, the N-type polysilicon films 5311, 5321, and the buried conductive materials 551, 552 are cut in a direction intersecting with the fin-shaped members FIN1, FIN2 using dry etching. More specifically, regions exposed by the second mask pattern MP2 in the P-type polysilicon films 5111, 5121, the I-type polysilicon films 5211, 5221, the N-type polysilicon films 5311, 5321, and the embedded conductive materials 551, 552 are selectively etched.

At the time, an uppermost insulation film (for example, I31) and resistance change films (for example, Re11, Re21) in each fin-shaped member (for example, FIN1) are prevented from being cut by providing a high etching selectivity ratio in dry etching, to those films, of the P-type polysilicon films 5111, 5121, the I-type polysilicon films 5211, 5221, the N-type polysilicon films 5311, 5321, and the embedded conductive materials 551, 552. The dry etching condition to achieve such an etching selectivity ratio is set in a 300 mm wafer chamber, for example, a gas pressure of equal to or more than 30 mTorr, a source power of 600 W, a bias power of equal to or less than 70 W, and a type of a gas of $CF_4$ or $NF_3$ or $Cl_2$.

Figure 8:
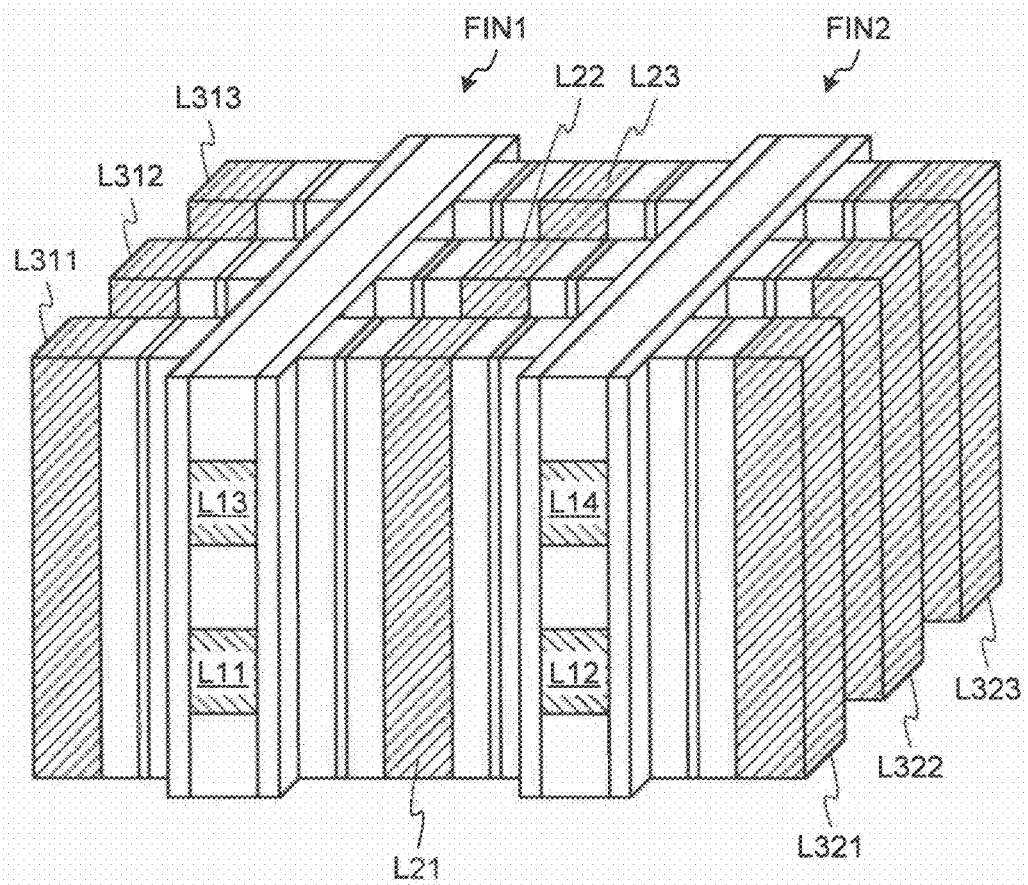
FIG. 8 is a view showing the method of manufacturing the non-volatile semiconductor memory device according to the first embodiment.

With the process, for example, the buried conductive material 551 is separated to a plurality of pillar members L21 to L23 extending approximately vertical to the surface SBa of the semiconductor substrate SB (refer to FIG. 3, FIG. 8). The buried conductive material 552 is separated to a plurality of pillar members L311 to L313 extending approximately vertical to the surface SBa of the semiconductor substrate SB, respectively (refer to FIG. 3, FIG. 8). The buried conductive material 553 is separated to a plurality of pillar members L321 to L323 extending approximately vertical to the surface SBa of the semiconductor substrate SB, respectively (refer to FIG. 3, FIG. 8).

Further, the P-type polysilicon film 5111 is separated to a plurality of pillar members (P-type polysilicon films) DP11 extending approximately vertical to the surface SBa of the semiconductor substrate SB, respectively (refer to FIG. 3). The I-type polysilicon film 5211 is separated to the plurality of pillar members (I-type polysilicon films) DI11 extending approximately vertical to the surface SBa of the semiconductor substrate SB (refer to FIG. 3). The N-type polysilicon film 5311 is separated to the plurality of pillar members (N-type polysilicon films) DN11 extending approximately vertical to the surface SBa of the semiconductor substrate SB, respectively (refer to FIG. 3). The embedded conductive material 551 is separated to the plurality of pillar members L21 to L23 extending approximately vertical to the surface SBa of the semiconductor substrate SB, respectively (refer to FIG. 3). Likewise, the P-type polysilicon film 5121, the I-type polysilicon film 5221, and the N-type polysilicon film 5321 are separated to a plurality of pillar members DP21, DI21, DN21, respectively (refer to FIG. 3).

Note that the plurality of pillar members L21 to L23 are designed such that the second plugs PG21 to PG23 prepared first are positioned to bottoms thereof. Finally, gaps are naturally filled with a gap-fill material such as polysilazane (not shown). Since polysilazane exhibits a good filling property, it is suitable for a structure having a longitudinally long high aspect ratio described above.

Thereafter, the insulation films 21, the first plugs PG111 to PG113, PG121 to PG123, and the fourth lines L41 to L43 are sequentially formed on the plurality of fin-shaped members FIN1, FIN2 (refer to FIG. 8) by a known method (refer to FIG. 1, FIG. 2A).

Although the explanation has been made above exemplifying specific material names, other materials may be used as long as they have the respective functions (insulation property, conductive property, rectifying property, and resistance change property). However, since tungsten is widely used in a silicon process and has a property of withstanding high temperature, it is a preferable material when annealing of a diode for activation is taken into consideration. Further, although the diode may be, for example, a Schottky diode and the like using metal as long as it has a rectifying property, a polysilicon P-I-N diode is preferable material because it has a small leak current.

As described above, in the first embodiment, ones (respective conductive films L11 to L14) of the word lines and the bit lines extend in parallel with the surface of the semiconductor substrate, and the others (the plurality of pillar members L21 to L23, L311 to L313, L321 to L323) extend approximately vertical to the surface of the semiconductor substrate. In the resistance change films, portions arranged at positions where the conductive films intersect with the pillar members, that is, portions arranged at positions where the word lines intersect with the bit lines function as storage units in the non-volatile memory cells MC111 to MC142 (refer to FIG. 2A). The structure is formed by patterning the plurality of word lines at a time and patterning the plurality of bit lines at a time. More specifically, in the process shown in FIG. 4D, the regions in the stacked structure SST exposed by the first mask pattern MP1 are selectively etched, thereby patterning the lines extending in parallel with the surface of the semiconductor substrate at a time. Further, in the process shown in FIG. 7B, the regions in the embedded conductive materials 551, 552 exposed by the second mask pattern MP2 are selectively etched, thereby patterning the lines extending approximately vertical to the surface of the semiconductor substrate at a time. More specifically, when the non-volatile memory cells are manufactured so as to be arranged in a vertical direction in addition to the horizontal direction, since the number of lithography processes does not increase, a large cost reduction effect can be obtained by improving the arrangement density. More specifically, the arrangement density can be easily improved to reduce the manufacturing cost of the non-volatile semiconductor memory device.

Since through-holes are not formed to the word lines and the bit lines, arrangement margins of the word lines and the bit lines are easily increased, and thus the word lines and the bit lines are unlike to be affected by an alignment offset. With the configuration, since it is not necessary to make the word lines and the bit lines wider than a width of the through-hole, respectively, the arrangement density of the non-volatile memory cells including the resistance change elements can be easily improved.

Further, since any of the first mask pattern MP1 and the second mask pattern MP2 is a so-called line and space pattern, fine patterns can be easily formed as compared with a case that through-holes are formed. The arrangement density of the non-volatile memory cells including the resistance change elements can be easily improved also from this point.

Note that the non-volatile semiconductor memory device may be configured such that the N-type polysilicon films, the I-type polysilicon films, and the P-type polysilicon films are arranged in order from sides near to the resistance change films. Otherwise, the non-volatile semiconductor memory device may be configured such that the I-type polysilicon films between the P-type polysilicon films and the N-type polysilicon films are omitted.

Further, as shown in FIG. 9, in the non-volatile semiconductor memory device 1$i$, the polysilicon films arranged on the sides far from the resistance change films (in the case shown in FIG. 1, the N-type polysilicon films) may be used as the lines extending approximately vertical to the surface SBa of the semiconductor substrate SB (that is, the respective second lines L21$i$ to L23$i$ or the respective third lines L311$i$ to L313$i$). In the case, since this configuration is obtained by a modification for omitting the second line L2 and merging the two N-type polysilicon films DN11, DN12 into one N-type polysilicon film, in this configuration, spaces between the resistance change films Re11 and the resistance change films Re12 in a direction intersecting with the first line L11 can be reduced with respect to, for example, the configuration shown in FIG. 3. With this configuration, the arrangement density of the non-volatile memory cells in the direction intersecting with the first line L11 can be easily improved.

Further, in this case, the processes shown in FIG. 6F, FIG. 6G become unnecessary, and in the process shown in FIG. 6H, N-type polysilicon is embedded between the plurality of fin-shaped members FIN1, FIN2 as a conductive material. With the process, the method of manufacturing the non-volatile semiconductor memory device can be simplified by reducing the number of processes so that the lines extending approximately vertical to the surface SBa of the semiconductor substrate SB can be easily fabricated.

Otherwise, as shown in FIG. 10, in the non-volatile semiconductor memory device 1$j$, a rectifying action may be given to at an interface between the resistance change film (that is, resistance change films Re11$j$ or Re21$j$) and the line (that is, the respective second lines L21$j$ to L23$j$ or the respective third lines L311$j$ to L313$j$) extending approximately vertical to the surface SBa of the semiconductor substrate SB. Specifically, the line (the respective first lines L11$j$, L13$j$) extending along the surface SBa of the semiconductor substrate SB and the line (that is, the respective second lines L21$j$ to L23$j$ or the respective third lines L311$j$ to L313$j$) extending approximately vertical to the surface SBa of the semiconductor substrate are formed of different metals from each other, and the resistance change film is formed of a metal oxide. For example, the first line is formed of tungsten, the second line or the third line is formed of gold or platinum, and resistance change film is formed of iron oxides. In the case, a Schottky conduction effect (rectifying action) can be given to an interface between the second line or the third line and the resistance change film. More specifically, a portion arranged at a position where the first line intersects with the second line or the third line in the interface between the second line or the third line and the resistance change films can be caused to function as a rectifying surface of the diodes (rectifying elements) in the non-volatile memory cells.

In the case, since this configurations obtained by a modification for omitting the P-type polysilicon films, the I-type polysilicon films, and the N-type polysilicon films, spaces between the resistance change films Re11 and the resistance change films Re12 in the direction intersecting with the first line can be reduced with respect to, for example, the configuration shown in FIG. 3. With this configuration, the arrangement density of the non-volatile memory cells in the direction intersecting with the first line L11 can be easily improved.

Further, in the case, the processes shown in FIG. 6B to FIG. 6G become unnecessary. With the process, the method of manufacturing the non-volatile semiconductor memory device can be simplified by reducing the number of processes so that the lines extending approximately vertical to the surface SBa of the semiconductor substrate SB can be easily fabricated.

Second Embodiment

Figure 11:
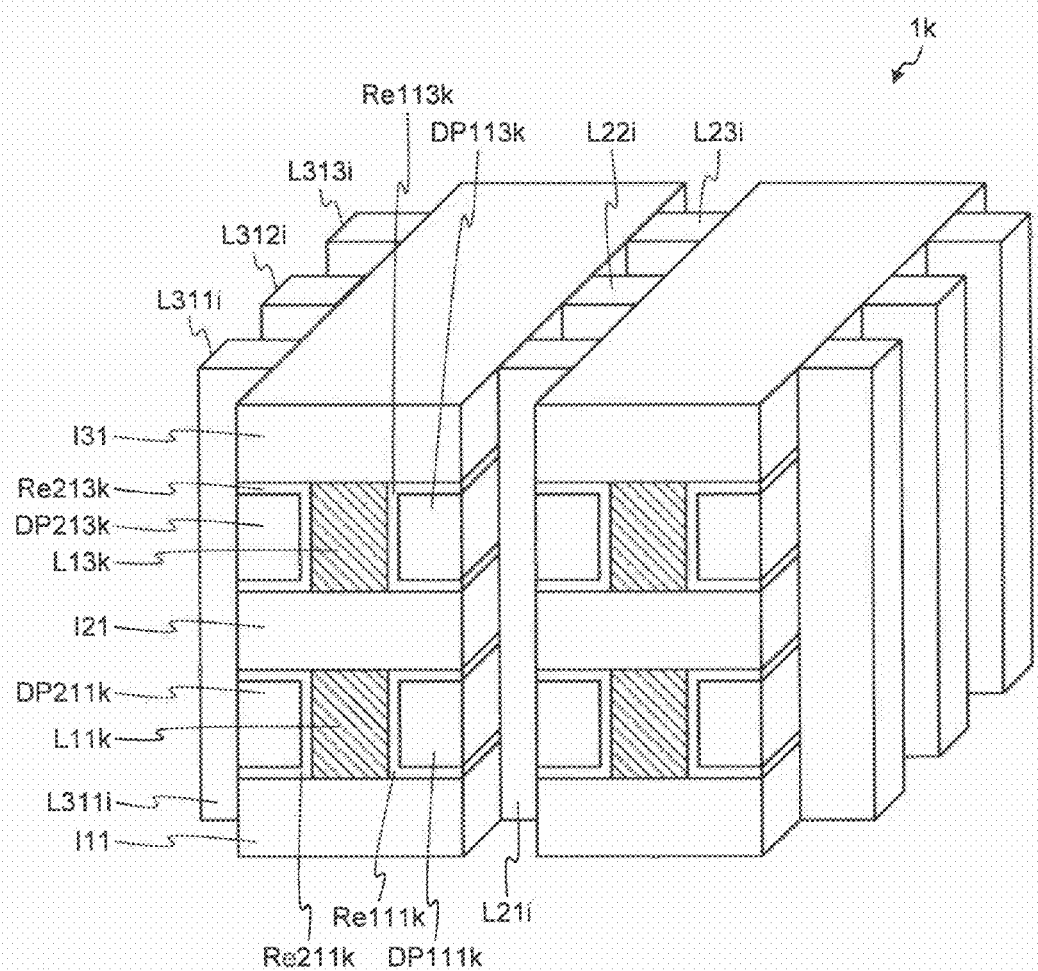
FIG. 11 is a view showing a configuration of a non-volatile semiconductor memory device according to a second embodiment.

A non-volatile semiconductor memory device 1k according to a second embodiment will be explained using FIG. 11. FIG. 11 is a perspective view showing a configuration of the non-volatile semiconductor memory device 1k according to the second embodiment. Portions different from the modification (non-volatile semiconductor memory device 1i) shown in FIG. 9 of the first embodiment will be mainly described below.

The non-volatile semiconductor memory device 1k includes a plurality of first lines L11k, L13k, resistance change films Re111k, Re113k, resistance change films (second resistance change film) Re211k, Re213k, and a plurality of P-type polysilicon films DP111k to DP213k.

The first lines L11k, L13k have a width narrower than that of upper/lower insulation films. The P-type polysilicon films DP111k, DP113k extend along one side surfaces of the first lines L11k, L13k, respectively. The resistance change films Re111k, Re113k are arranged between the first lines L11k, L13k and the upper/lower insulation films and the P-type polysilicon films DP111k, DP113k, respectively. More specifically, the resistance change films Re111k, Re113k extend along the one first lines L11k, L13k as well as over the plurality of second lines L21i to L23i in a stripe state, respectively. Specifically, the resistance change films Re111k, Re113k include two sheet-like members and one sheet-like member. Main surfaces of the two sheet-like members are in parallel with a surface SBa of a semiconductor substrate SB, and the two sheet-like members extend along one first line L11k, or L13k while facing each other. The one sheet-like member extends along one first line L11k, or L13k while connecting end portions of the two sheet-like members on the first lines L11k, L13k side to each other. More specifically, the resistance change films Re111k, Re113k have approximately C-shaped cross sections vertical to a longitudinal direction, respectively. The P-type polysilicon films DP111k, DP113k extend along the surface SBa of the semiconductor substrate SB inside of the resistance change films Re111k, Re113k, respectively. More specifically, the resistance change films Re111k, Re113k cover one side surfaces, upper surfaces, and lower surfaces of the P-type polysilicon films DP111k, DP113k, respectively. Further, I-type polysilicon films DI11 between the P-type polysilicon films DP111k, DP113k and the second lines (N-type polysilicon films) L21i to L23i are omitted.

The P-type polysilicon film DP211k, DP213k extend along side surfaces of the first lines L11k, L13k opposite to the one side surfaces described above, respectively. The resistance change films Re211k, Re213k are arranged between the first lines L11k, L13k and the upper/lower insulation films and the P-type polysilicon films DP211k, DP213k, respectively. More specifically, the resistance change films Re211k, Re213k extend along the one first line L11k, or L13k as well as over the plurality of third lines L311i to L313i in the stripe state, respectively. Specifically, the resistance change films Re111k, Re113k include two sheet-like members and one sheet-like member. Main surfaces of the two sheet-like members are in parallel with the surface SBa of the semiconductor substrate SB and the two sheet-like members extend along one first line L11k, or L13k while facing each other. The one sheet-like member extends along one first line L11k, or L13k while connecting end portions of the two sheet-like members on the first lines L11k, L13k side to each other. More specifically, the resistance change films Re211k, Re213k have approximately C-shaped cross sections vertical to a longer direction, respectively. The P-type polysilicon films DP211k, DP213k extend along the surface SBa of the semiconductor substrate SB inside of the resistance change films Re211k, Re213k, respectively. Further, I-type polysilicon films DI21 between the P-type polysilicon films DP211k, DP213k and the third lines (N-type polysilicon films) L311i to L313i are omitted.

As described above, the P-type polysilicon films extend along the first line, that is, along the surface SBa of the semiconductor substrate SB, and the N-type polysilicon films extend approximately vertical to the surface SBa of the semiconductor substrate SB as the second line or the third line. With the configuration, junctions between the P-type polysilicon films and the N-type polysilicon films, that is, PN-junction interfaces are formed to the respective non-volatile memory cells. As a result, a sneak current, which flows backward in diodes (rectifying elements) of the respective non-volatile memory cells, can be reduced.

Note that the N-type polysilicon films may extend along the first line, that is, along the surface SBa of the semiconductor substrate SB, and the P-type polysilicon films may extend approximately vertical to the surface SBa of the semiconductor substrate SB as the second line or the third line. Even in the case, the junctions between the P-type polysilicon films and the N-type polysilicon films, that is, the PN-junction interfaces are formed to the respective non-volatile memory cells. Further, I-type polysilicon films may be arranged between the P-type polysilicon films and the second lines or the third lines (N-type polysilicon films) as shown in FIG. 9.

Further, a method of manufacturing the non-volatile semiconductor memory device 1k is different from the modification of the first embodiment shown in FIG. 9 in the following points.

Figure 12A:
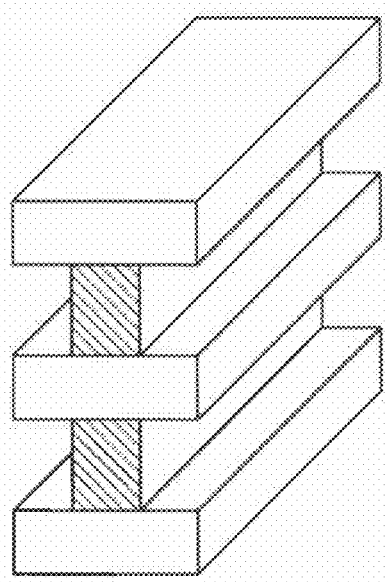
FIG. 12A to FIG. 12D are views showing a method of manufacturing the non-volatile semiconductor memory device according to the second embodiment.
Figure 12B:
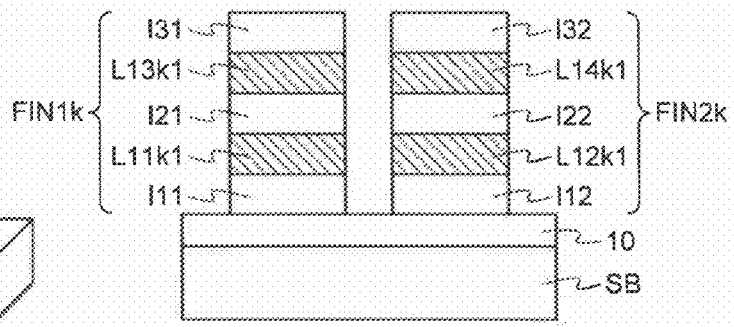

In a process shown in FIG. 12B, a plurality of fin-shaped member FIN1k, FIN2k each having a somewhat wide width are formed. The width is set in consideration that conductive films (for example, films formed of tungsten) L11k1 to L14k1 are thinned later and that a material of the resistance change films and polysilicon are embedded in recesses formed by thinning the conductive films.

Figure 12C:
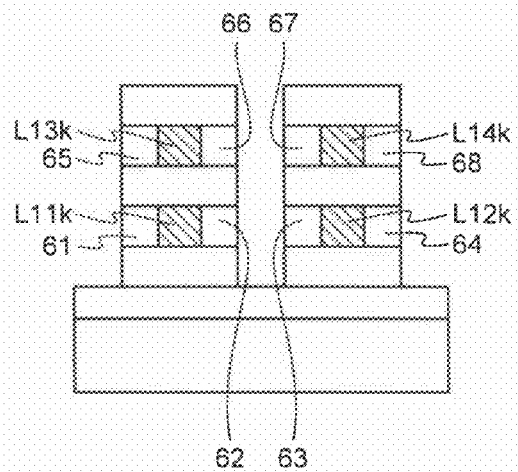

In a process shown in FIG. 12C (eighth process), side walls of the conductive films L11k1 to L14k1 are oxidized by a method of $O_2$ plasma such as asher, thermal oxidation, and the like. With the process, side wall portions of the conductive films L11k1 to L14k1 are transformed to oxide films 61 to 68 and not-oxidized portions in the vicinities of center portions are remained as the conductive films L11k to L14k. More specifically, the conductive films L11k1 to L14k1 in the respective plurality of fin-shaped members FIN1k, FIN2k are thinned.

Figure 12D:
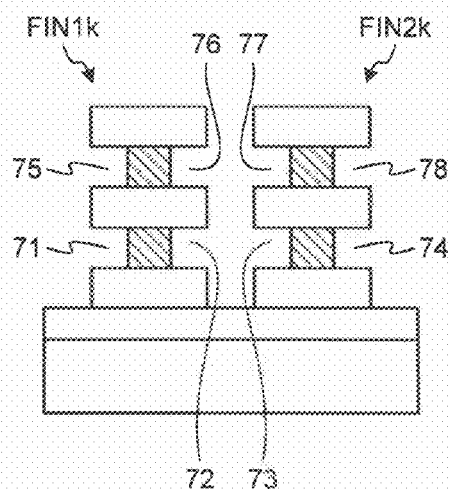

In a process shown in FIG. 12D (eighth process), the oxide films 61 to 68 are selectively removed by dissolving with an alkaline solution of TMY (choline) and the like or an acid solution of hydrochloric acid and the like. With the process, recesses 71 to 78 are formed to both side surfaces of the respective plurality of fin-shaped members FIN1k, FIN2k (refer to FIG. 12A). For example, when the conductive films L11k1 to L14k1 are formed of tungsten, since the oxide films 61 to 68 are transformed to tungsten oxides, using the alkaline solution as etchant more increases an etching rate of the oxide films 61 to 68.

Figure 13A:
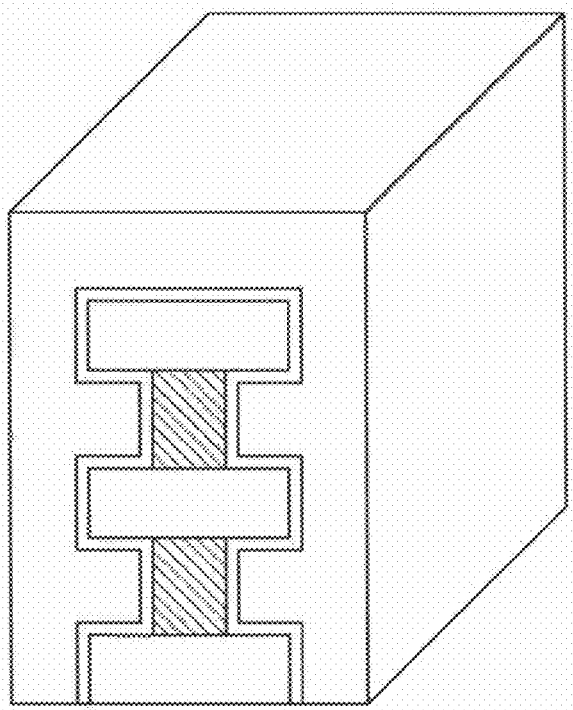
FIG. 13A to FIG. 13C are views showing the method of manufacturing the non-volatile semiconductor memory device according to the second embodiment.
Figure 13B:
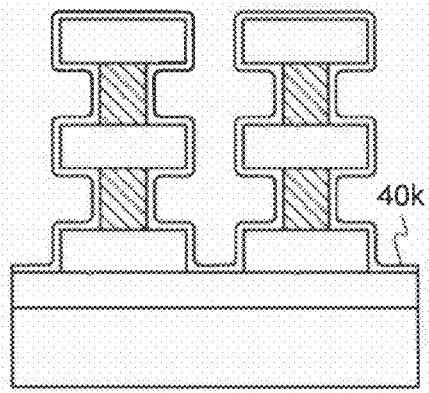

In a process shown in FIG. 13B, films 40k of a resistance change material are deposited by CVD and the like so as to entirely cover inner surfaces of the recesses 71 to 78 formed in the process shown in FIG. 12D.

Figure 13C:
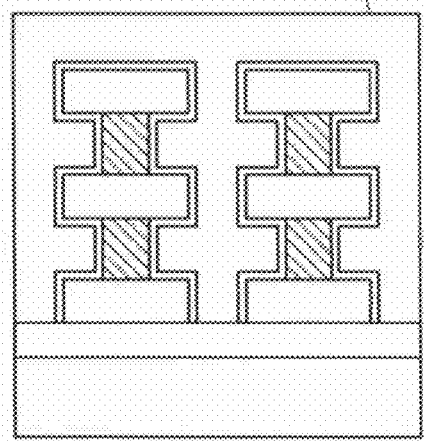

In a process shown in FIG. 13C (ninth process), P-type polysilicon films 51k are entirely deposited by CVD and the like so as to embed P-type polysilicon in the recesses 71 to 78 (refer to FIG. 13A).

Figure 14:
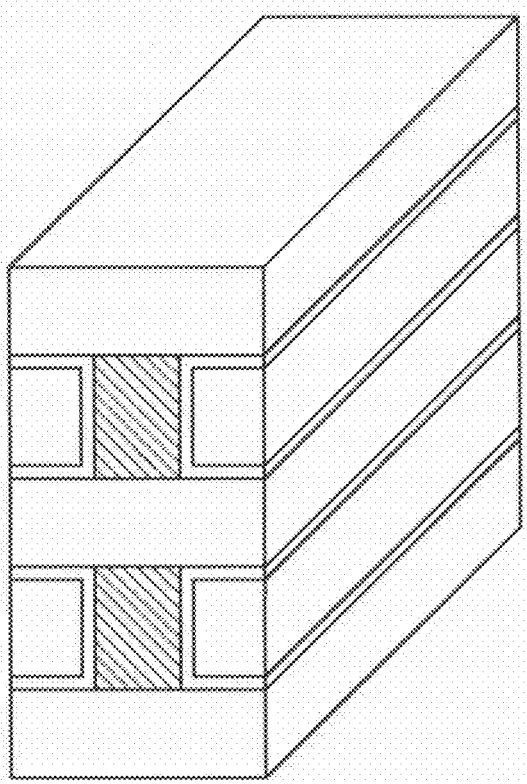
FIG. 14 is a view showing the method of manufacturing the non-volatile semiconductor memory device according to the second embodiment.

In a process shown in FIG. 14, the films 40k of the resistance change material and the P-type polysilicon films 51k are removed by performing etch back such that the embedded portions are remained. At the time, although it is considered that a device is not adversely affected in operation even if the films 40k of the resistance change material are not etched back, it is assumed here that the films 40k of the resistance change material are also etched back.

Figure 15A:
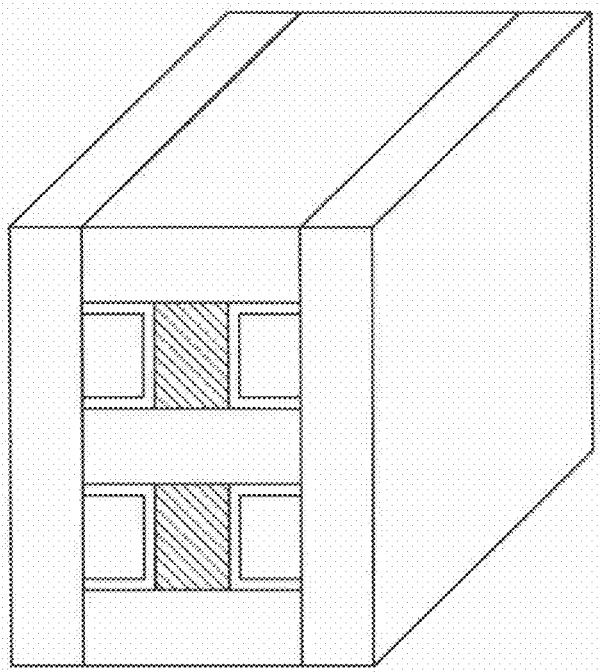
FIG. 15A to FIG. 15C are views showing the method of manufacturing the non-volatile semiconductor memory device according to the second embodiment.
Figure 15B:
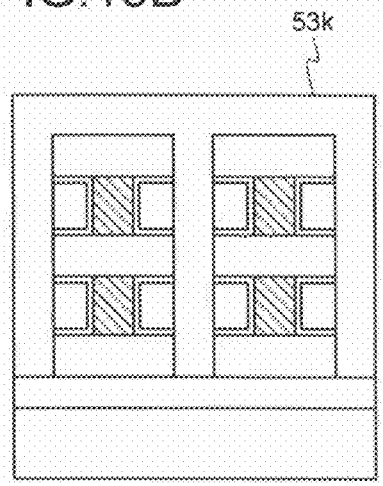

In a process shown in FIG. 15B, N-type polysilicon films 53k are entirely deposited by CVD and the like.

Figure 15C:
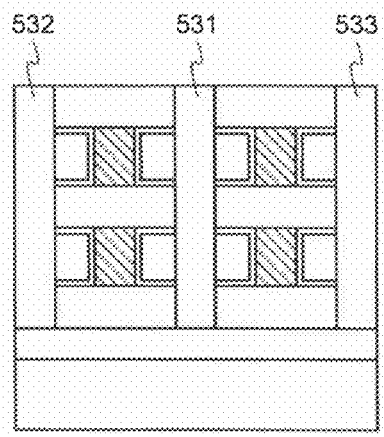

In a process shown in FIG. 15C, N-type polysilicon films 531 to 533 are remained to respective side walls of the plurality of fin-shaped members FIN1k, FIN2k by performing etch back. More specifically, the N-type polysilicon films 531 to 533 are embedded between the plurality of fin-shaped members FIN1k, FIN2k as a conductive material.

Thereafter, by performing the same process as the process shown in FIGS. 7A and 7B, the lines (that is, the respective second lines L21i to L23i or the respective third lines L311i to L313i) extending approximately vertical to the surface SBa of the semiconductor substrate SB are formed (refer to FIG. 11).

As described above, a structure, in which the P-type polysilicon films extend along the first line, that is, along the surface SBa of the semiconductor substrate SB and the N-type polysilicon films extend approximately vertical to the surface SBa of the semiconductor substrate SB as the second line or the third line, can be formed (refer to FIG. 15A).

Note that, in a non-volatile semiconductor memory device 1n shown in FIG. 16, resistance change films (for example, resistance change films Re11n) may be arranged between the polysilicon films (for example, the P-type polysilicon films DP111k, DP113k) extending along the surface SBa of the semiconductor substrate SB and the N-type polysilicon film (for example, the second line L21i) extending approximately vertical to the surface SBa of the semiconductor substrate SB. More specifically, the resistance change films may be used also as I-type semiconductor films in PIN diodes (in substitution for the I-type polysilicon films). With the configuration, a current flowing to adjacent non-volatile memory cells via the P-type polysilicon films or the N-type polysilicon films can be easily reduced.

Third Embodiment

Figure 17:
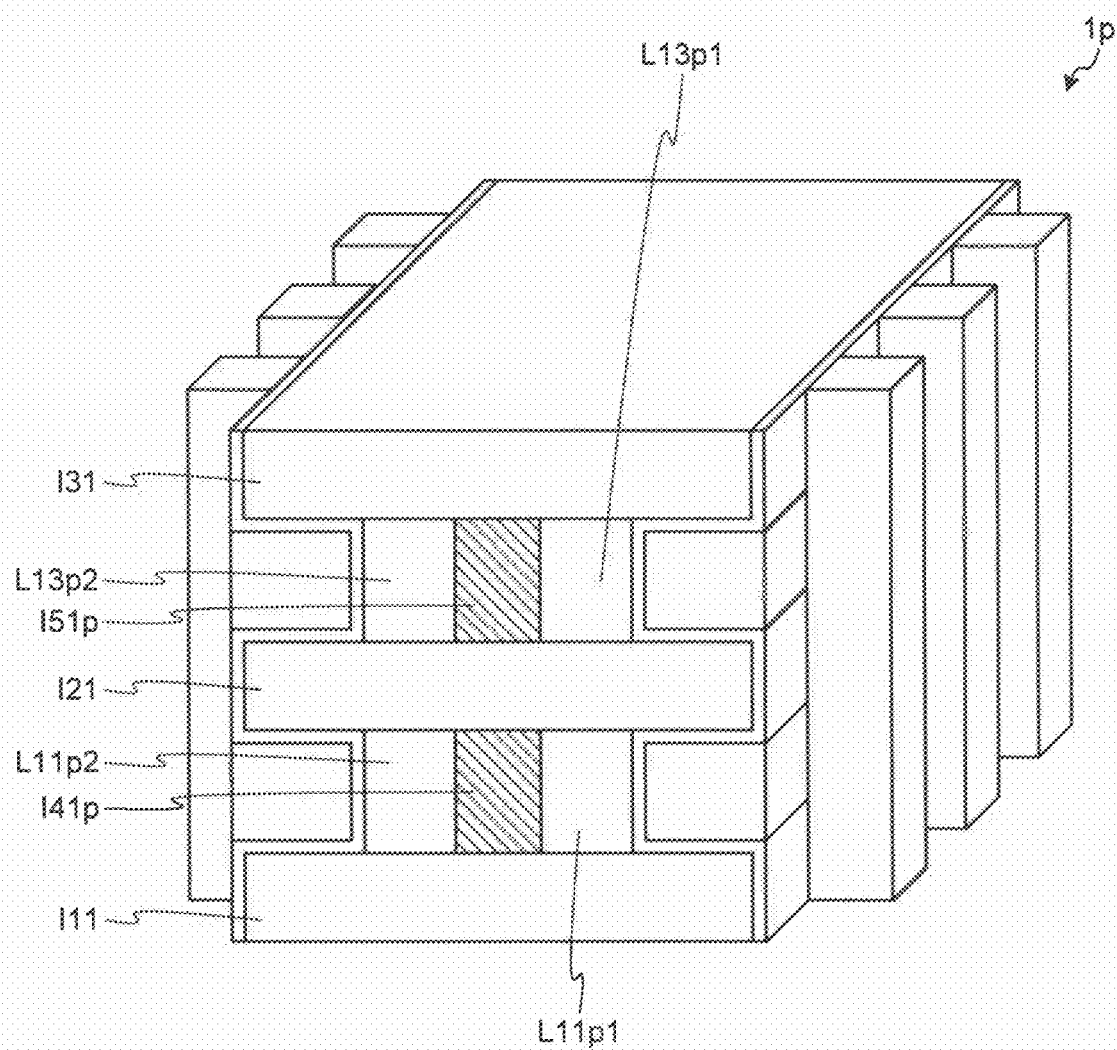
FIG. 17 is a view showing a configuration of a non-volatile semiconductor memory device according to a third embodiment.

A non-volatile semiconductor memory device 1p according to a third embodiment will be explained using FIG. 17. FIG. 17 is a perspective view showing a configuration of the non-volatile semiconductor memory device 1p according to the third embodiment. Portions different from the second embodiment will be mainly explained below.

The non-volatile semiconductor memory device 1p includes insulation films I41p, I51p and the plurality of first lines L11p1, L11p2, L13p1, L13p2. The insulation film I41p is arranged between an insulation film I11 and an insulation film I21 and has a width narrower than that of the insulation film I11 and the insulation film I21. The plurality of first lines L11p1, L11p2 are arranged on both sides of the insulation film I41p. More specifically, this configuration is obtained by a modification that a first line 11k (refer to FIG. 11) is divided into the two first lines L11p1, L11p2 and the two first lines L11p1, L11p2 are arranged on both sides of the insulation film I41p.

Likewise, the insulation film I51p is arranged between the insulation film I21 and an insulation film I31 and has a width narrower than that of the insulation film I21 and the insulation film I31. The plurality of first lines L13p1, L13p2 are arranged on both sides of the insulation film I51p. More specifically, this configuration is obtained by a modification that a first line 13k (refer to FIG. 11) is divided into the two first lines L13p1, L13p2 and the two first lines L13p1, L13p2 are arranged on both sides of the insulation film I51p.

The structure is suitable for easily forming fin-shaped members as described below. More specifically, a method of manufacturing the non-volatile semiconductor memory device 1p is different from the second embodiment in the following points.

Figure 18A:
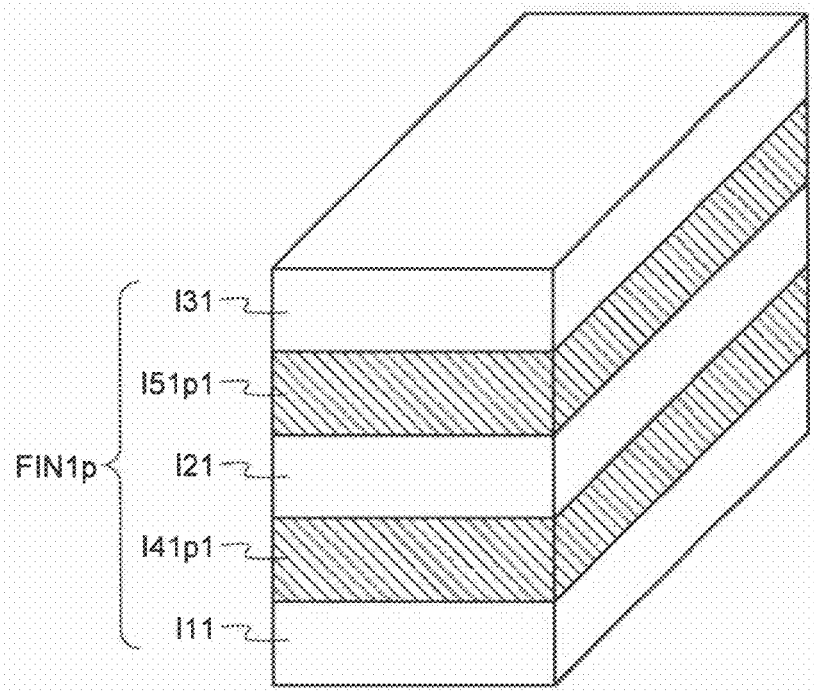
FIG. 18A to FIG. 18C are views showing a method of manufacturing the non-volatile semiconductor memory device according to the third embodiment.
Figure 18B:
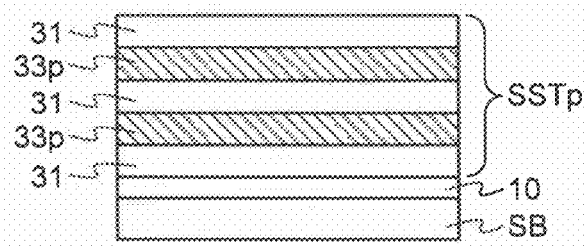

In a process shown in FIG. 18B (first process), a stacked structure SSTp, in which insulation layers (first layers) 31 and insulation layers (second layers) 33p are alternately stacked multiple times, respectively, is formed on a lower layer 10. Specifically, a process for forming insulation layers 31 and a process for forming the insulation layers 33p are alternately repeated multiple times (for example, eight times, or twice as shown in FIG. 18B), after that, a process for forming a insulation layer 31 is performed once. The insulation layers 33p are formed of, for example, SiN (silicon nitride film) by CVD.

Figure 18C:
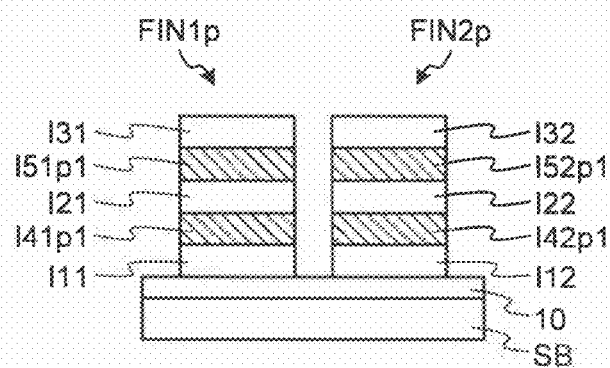

In a process (third process) shown in FIG. 18C, the stacked structure SSTp is cut to many fins arranged side by side with each other (for example, in parallel with each other) using dry etching. More specifically, a region in the stacked structure SSTp exposed by a first mask pattern MP1 is selectively etched such that the stacked structure SSTp is divided to a plurality of fin-shaped members FIN1p, FIN2p.

If the stacked structure SSTp includes conductive layers (for example, layers formed of tungsten), etching must be performed by alternately switching an etching gas when the insulation layers are etched and an etching gas when the conductive layers are etched.

In contrast, in the third embodiment, since insulation layers (for example, layers formed of $SiO_2$) and other insulation layers (layers formed of, for example, SiN) are included the stacked structure SSTp, the insulation layers and the other insulation layers can be processed by etching which uses the same etching gas. As a result, it is easy to process the plurality of fin-shaped members FIN1p, FIN2p from the stacked structure.

In the fin-shaped member FIN1p, the insulation films (for example, $SiO_2$) and the other insulation films (for example, SiN) are alternately stacked. In the fin-shaped member FIN1p, for example, the insulation film I11, other insulation film 41p1, the insulation film I21, the other insulation film I51p1, and the insulation film I31 are sequentially stacked. In the fin-shaped member FIN2p, the insulation films and the other insulation films are alternately stacked. In the fin-shaped member FIN2p, for example, the insulation film I12, other insulation film I42p1, the insulation film I22, other insulation film 52p1, and the insulation film I32 are sequentially stacked. The insulation films I11 to I32 are formed of, for example, $SiO_2$, respectively. The insulation film I41p1, the insulation film I42p1, the insulation film I51p1, and an insulation film I52p1 are formed of, for example, a SiN (silicon nitride) film, respectively.

Figure 19:
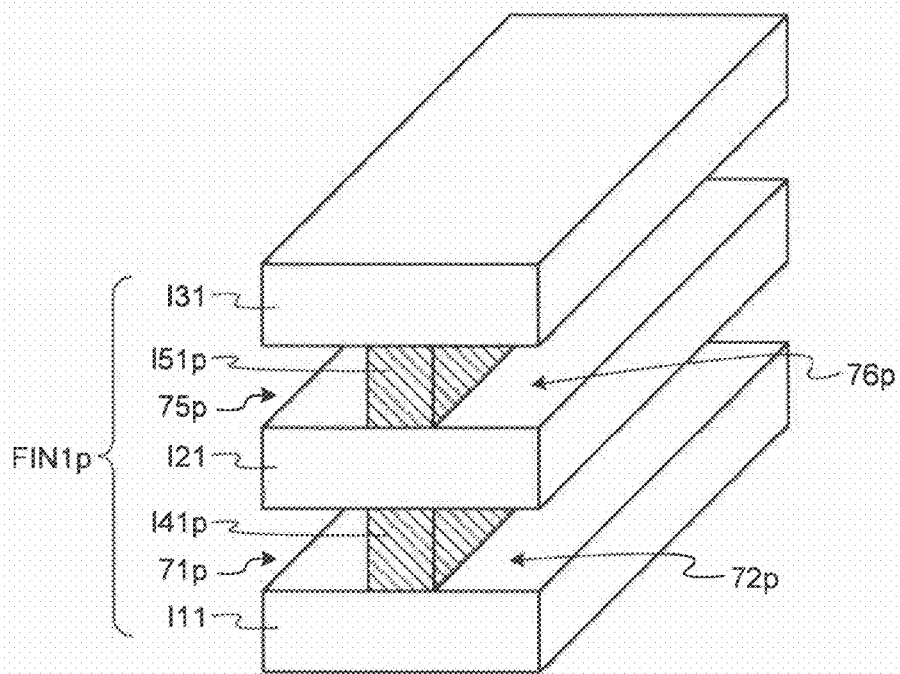
FIG. 19 is a view showing the method of manufacturing the non-volatile semiconductor memory device according to the third embodiment.

In a process shown in FIG. 19, the nitride film is thinned by wet etching using hot phosphoric acid. With the process, recesses 71p, 72p, 75p, 76p are formed on both side surfaces of the fin-shaped member FIN1p.

Figure 20:
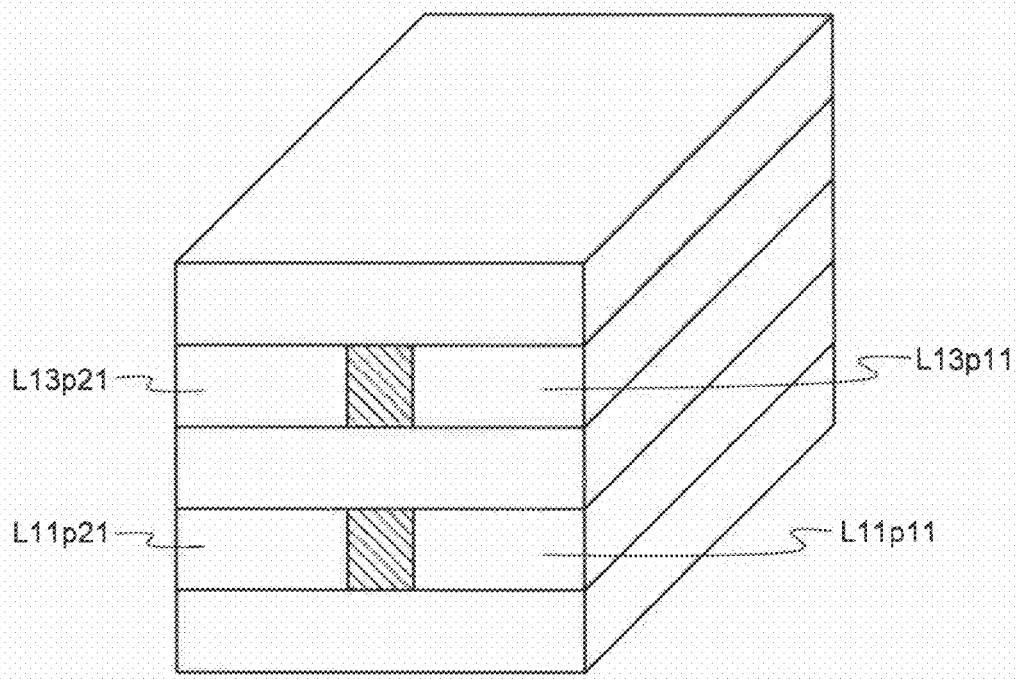
FIG. 20 is a view showing the method of manufacturing the non-volatile semiconductor memory device according to the third embodiment.

In a process shown in FIG. 20, conductive films are entirely deposited by CVD and the like to embed a conductive material (for example, tungsten) in the recesses 71p, 72p, 75p, 76p. Then, the conductive films are removed by performing etch back such that the embedded portions of the conductive films are remained.

Thereafter, the same processes as the process shown in FIG. 12C and the subsequent processes are performed likewise the second embodiment.

Fourth Embodiment

Figure 21:
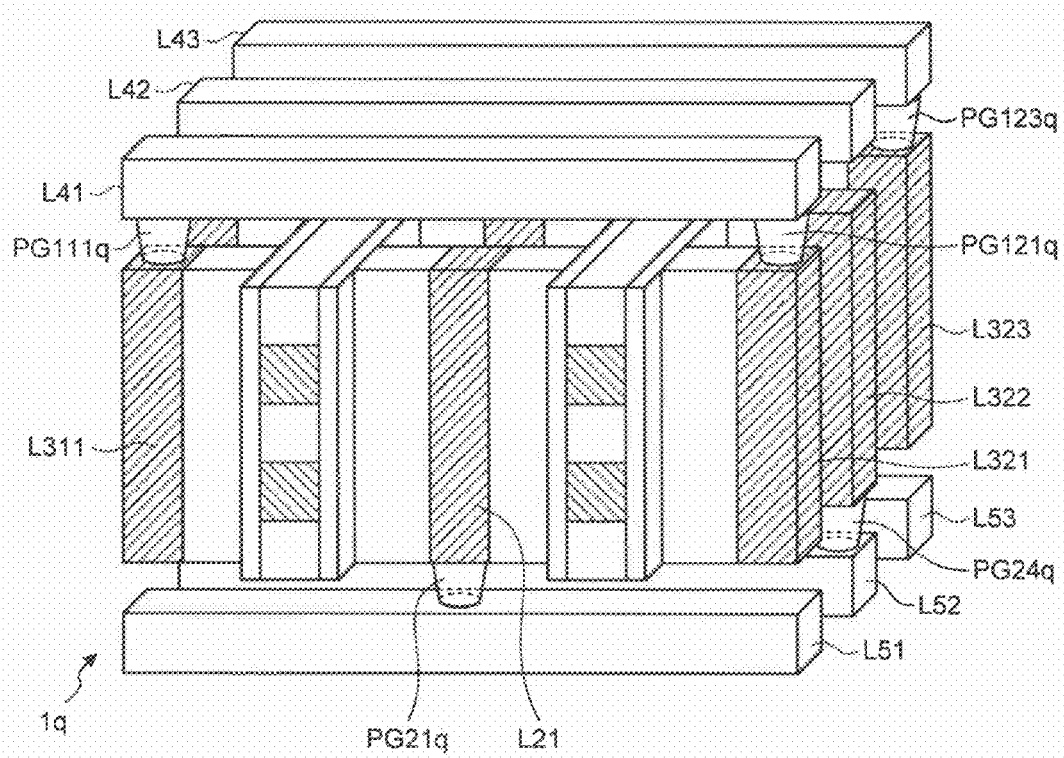
FIG. 21 is a view showing a configuration of a non-volatile semiconductor memory device according to a fourth embodiment.
Figure 22:
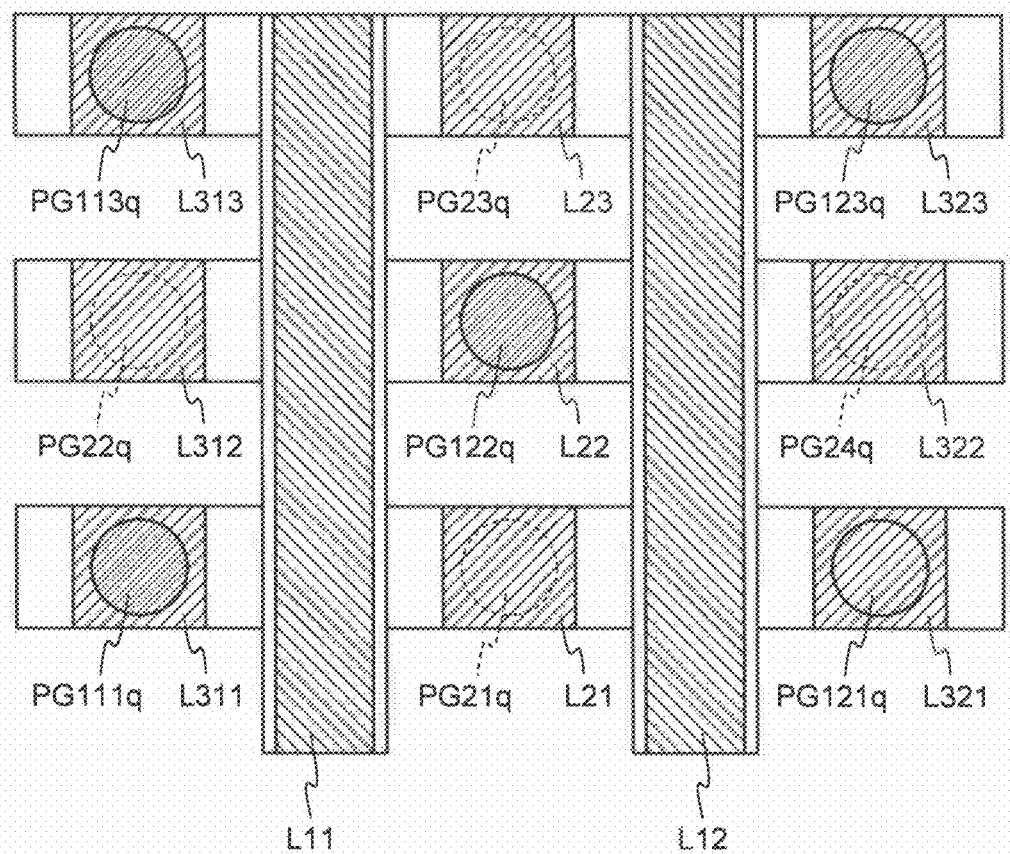
FIG. 22 is a view showing a layout configuration of the non-volatile semiconductor memory device according to the fourth embodiment.

A non-volatile semiconductor memory device 1q according to the fourth embodiment will be explained using FIGS. 21, 22. FIG. 21 is a perspective view showing a configuration of the non-volatile semiconductor memory device 1q according to the fourth embodiment. FIG. 22 is a view showing a layout configuration of the non-volatile semiconductor memory device 1q according to the fourth embodiment. Portions different from the first embodiment will be mainly explained below.

The non-volatile semiconductor memory device 1q includes a plurality of first plugs PG111q, PG113q, PG121q to PG123q, a plurality of second plugs PG21q to PG24q.

The plurality of first plugs PG111q, PG113q, PG121q to PG123q are arranged in a first checkered pattern when viewed from a direction vertical to a surface SBa of a semiconductor substrate SB. Further, the plurality of second plugs PG21q to PG24q are arranged in a second checkered pattern which is shifted by a half arrangement pitch of the first checkered pattern to a direction along the first plane VP11 shown in FIG. 3 and to the direction intersecting with the first plane VP11. In other words, the plurality of second plugs PG21q to PG24q are arranged such that arrangement of the plurality of second plugs PG21q to PG24q are shifted by a half arrangement pitch to upper, lower, right and left directions (that is, to a direction along the first plane VP11 shown in FIG. 3 and to the direction intersecting with the first plane VP11) with respect to the arrangement of the plurality of first plugs, respectively when viewed from a direction vertical to the surface SBa of the semiconductor substrate SB.

More specifically, in the non-volatile semiconductor memory device 1q, first plugs and second plugs are alternately arranged side by side in a direction vertical to a first line L11 when viewed from a direction vertical to the surface SBa of the semiconductor substrate SB. On the left side of the first line L11 in FIG. 22, the first plug PG111q, the second plug PG22q, and the first plug PG113q are sequentially arranged side by side from downward to upward in the drawing in a direction along the first line L11. Between the first line L11 and a first line L12 in FIG. 22, the second plug PG21q, the first plug PG122q, the second plug PG23q are sequentially arranged side by side from downward to upward in the drawing in the direction along the first line L11. On the right side of the first line L12 in FIG. 22, the first plug PG121q, the second plug PG24q, the first plug PG123q are sequentially arranged side by side from downward to upward in the drawing in a direction along the first line L12.

In the configuration, since it is possible to increase a pitch between the plugs having substantially the same height from the semiconductor substrate SB, lithography and processes can be easily performed as well as the arrangement density of non-volatile memory cells in a direction where the second lines are arranged (where third lines are arranged) can be more easily improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device comprising:
   a semiconductor substrate;
   a plurality of first lines arranged side by side in a first plane approximately vertical to a surface of the semiconductor substrate, each of the plurality of first lines extending along the surface of the semiconductor substrate;
   a plurality of second lines arranged side by side in a second plane along the first plane, each of the plurality of second lines extending approximately vertical to the surface of the semiconductor substrate; and
   a plurality of non-volatile memory cells arranged at positions where the plurality of first lines intersect with the plurality of second lines,
   wherein a resistance change film continuously extending over the plurality of second lines is arranged between the plurality of first lines and the plurality of second lines,
   and wherein each of the plurality of non-volatile memory cells includes
      a resistance change element, and
      a rectifying element connected in series to the resistance change element; and
   the resistance change element includes a portion of the resistance change film, the portion being arranged at the position where the first line intersects with the second line,
   the resistance change film extends in a plate state so as to exist on the plurality of first lines as well as on the plurality of second lines between the plurality of first lines and the plurality of second lines,
   and wherein a first conductive type semiconductor and a second conductive type semiconductor are arranged between the resistance change film and the second line,
   the first conductive type semiconductor extends in a line state approximately vertical to the surface of the semiconductor substrate, and
   the second conductive type semiconductor extends in a line state approximately vertical to the surface of the semiconductor substrate and is located on a side opposite to the first conductive type semiconductor, and the rectifying element includes
   a portion in a stripe of the first conductive type semiconductor intersecting with the first line, and
   a portion in a stripe of the second conductive type semiconductor intersecting with the first line.

2. The non-volatile semiconductor memory device according to claim 1, wherein
   the second conductive type semiconductor and the second line are communalized, and
   the rectifying element includes
      a portion in the stripe of the first conductive type semiconductor intersecting with the first line, and
      a portion in the second line intersecting with the first line.

3. The non-volatile semiconductor memory device according to claim 1, wherein
   the resistance change film is formed of metal oxides.

4. The non-volatile semiconductor memory device according to claim 1, further comprising:
   a plurality of third lines arranged side by side in a third plane which is on a side opposite to the second lines across the first lines and which extends along the first lines, each of the plurality of third lines extending approximately vertical to the surface of the semiconductor substrate;
   a plurality of second non-volatile memory cells arranged at positions where the plurality of first lines intersect with the plurality of third lines,
   wherein a second resistance change film continuously extending over the plurality of third lines are arranged between the plurality of first lines and the plurality of third lines,
   and wherein each of the plurality of second non-volatile memory cells includes
      a second resistance change element; and
      a second rectifying element connected in series to the second resistance change element, and
   the second resistance change element includes a portion of the second resistance change film, the portion being arranged at the position where the first line intersects with the third line.

5. The non-volatile semiconductor memory device according to claim 4, wherein
   the resistance change film extends in a sheet state so as to exist on the plurality of first lines as well as on the plurality of second lines between the plurality of first lines and the plurality of second lines, and
   the second resistance change film extends in a sheet state so as to exist on the plurality of first lines as well as on the plurality of third lines between the plurality of first lines and the plurality of third lines.

6. The non-volatile semiconductor memory device according to claim 4, wherein
   the resistance change film extends in a stripe state so as to exist on one first line as well as on the plurality of second lines between the first line and the plurality of second lines, and
   the second resistance change film extends in a stripe state so as to exist on one first line as well as on the plurality of third lines between the first line and the plurality of third lines.

7. A non-volatile semiconductor memory device comprising:
   a semiconductor substrate;
   a plurality of first lines arranged side by side in a first plane approximately vertical to a surface of the semiconductor substrate, each of the plurality of first lines extending along the surface of the semiconductor substrate;
   a plurality of second lines arranged side by side in a second plane along the first plane, each of the plurality of second lines extending approximately vertical to the surface of the semiconductor substrate;
   a plurality of non-volatile memory cells arranged at positions where the plurality of first lines intersect with the plurality of second lines;
   a plurality of third lines arranged side by side in a third plane which is on a side opposite to the second lines across the first lines and which extends along the first lines, each of the plurality of third lines extending approximately vertical to the surface of the semiconductor substrate; and
   a plurality of second non-volatile memory cells arranged at positions where the plurality of first lines intersect with the plurality of third lines,
   wherein a resistance change film continuously extending over the plurality of second lines is arranged between the plurality of first lines and the plurality of second lines,
   and each of the plurality of non-volatile memory cells includes:
      a resistance change element, and
      a rectifying element connected in series to the resistance change element; and
   the resistance change element includes a portion of the resistance change film, the portion being arranged at the position where the first line intersects with the second line,
   a second resistance change film continuously extending over the plurality of third lines are arranged between the plurality of first lines and the plurality of third lines,
   and each of the plurality of second non-volatile memory cells includes:
      a second resistance change element, and
      a second rectifying element connected in series to the second resistance change element; and
   the second resistance change element includes a portion of the second resistance change film, the portion being arranged at the position where the first line intersects with the third line,
   a plurality of fourth lines extending so as to intersect with the first line above the plurality of second lines and the plurality of third lines;
   a plurality of fifth lines extending so as to intersect with the first line between the semiconductor substrate and the plurality of second lines and the plurality of third lines;
   a plurality of first plugs, each connecting one of the second line and the third line to the fourth line, the second line and the third line facing each other; and
   a plurality of second plugs, each connecting the other of the second line and the third line to the fifth line, the second line and the third line facing each other.

8. The non-volatile semiconductor memory device according to claim 7, wherein
   each of the plurality of first plugs connects the second line to the fourth line, and
   each of the plurality of second plugs connects the third line to the fifth line.

9. The non-volatile semiconductor memory device according to claim 7, wherein
   the plurality of first plugs are arranged in a first checkered pattern when viewed from a direction vertical to the surface of the semiconductor substrate and
   the plurality of second plugs are arranged in a second checkered pattern which is shifted by a half arrangement pitch of the first checkered pattern respective to a direction along the first line and to a direction approximately vertical to the first line, when viewed from a direction vertical to the surface of the semiconductor substrate.

10. A non-volatile semiconductor memory device comprising:
   a semiconductor substrate;
   a plurality of first lines arranged side by side in a first plane approximately vertical to a surface of the semiconductor substrate, each of the plurality of first lines extending along the surface of the semiconductor substrate;
   a plurality of second lines arranged side by side in a second plane along the first plane, each of the plurality of second lines extending approximately along the surface the surface of the semiconductor substrate; and
   a plurality of non-volatile memory cells arranged at positions where the plurality of first lines intersect with the plurality of second lines,
   wherein a resistance change film continuously extending over the plurality of second lines is arranged between the plurality of first lines and the plurality of second lines, the resistance change film extending in a groove state along the surface of the semiconductor substrate,
   and each of the plurality of non-volatile memory cells includes
      a resistance change element, and
      a rectifying element connected in series to the resistance change element; and
   the resistance change element includes a portion of the resistance change film, the portion being arranged at the position where the first line intersects with the second line.

11. The non-volatile semiconductor memory device according to claim 10, wherein
   a first conductive type semiconductor extending in a line state vertical to the surface of the semiconductor substrate,
   the rectifying element includes
      a portion in the stripe of the first conductive type semiconductor intersecting with the second line, and
      a portion in the second line intersecting with the first line; and
   the second line includes a second conductive type semiconductor opposite to the first conductive type.

12. The non-volatile semiconductor memory device according to claim 10, wherein
   a first conductive type semiconductor extending in a line state vertical to the surface of the semiconductor substrate is arranged,
   the rectifying element includes
      a portion intersecting with the second line in the stripe of the first conductive type semiconductor, and
      a portion intersecting with the first line in the second line; and
   the second line includes a second conductive type semiconductor opposite to the first conductive type.

13. The non-volatile semiconductor memory device according to claim 10, wherein
   the resistance change film covers one side surface, an upper surface, and a lower surface of the plurality of second lines and have approximately C-shaped cross sections vertical to a longitudinal direction.

* * * * *